(12) United States Patent
Chen et al.

(10) Patent No.: US 9,048,345 B2
(45) Date of Patent: Jun. 2, 2015

(54) METHOD OF FORMING LIGHT-EMITTING DIODE

(71) Applicant: EPISTAR CORPORATION, Hsinchu (TW)

(72) Inventors: Yi-Ming Chen, Hsinchu (TW);
Tzu-Chieh Hsu, Hsinchu (TW);
Chi-Hsing Chen, Hsinchu (TW);
Hsin-Ying Wang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 14/196,708

(22) Filed: Mar. 4, 2014

(65) Prior Publication Data

US 2014/0295588 A1      Oct. 2, 2014

Related U.S. Application Data

(62) Division of application No. 12/981,776, filed on Dec. 30, 2010, now abandoned.

(51) Int. Cl.
*H01L 33/00*    (2010.01)
*H01L 21/02*    (2006.01)

(52) U.S. Cl.
CPC .......... *H01L 33/005* (2013.01); *H01L 33/0079* (2013.01); *H01L 21/02436* (2013.01); *H01L 21/02664* (2013.01)

(58) Field of Classification Search
CPC ............ H01L 33/079; H01L 21/02436; H01L 21/02664
See application file for complete search history.

(56) References Cited

U.S. PATENT DOCUMENTS

| | | | |
|---|---|---|---|
| 5,625,206 A | 4/1997 | Chandrasekhar et al. | |
| 6,969,626 B2 * | 11/2005 | Guo et al. | 438/29 |
| 7,867,620 B1 * | 1/2011 | Yao et al. | 428/450 |
| 2003/0020084 A1 | 1/2003 | Fan et al. | |
| 2008/0153395 A1 | 6/2008 | Kulp et al. | |
| 2008/0230923 A1 | 9/2008 | Jo et al. | |
| 2009/0197040 A1 | 8/2009 | Hanada et al. | |

FOREIGN PATENT DOCUMENTS

| | | |
|---|---|---|
| CN | 101494267 A | 7/2009 |
| TW | 200531319 | 3/1994 |
| WO | WO-2007133044 A1 | 11/2007 |
| WO | WO-2009044923 A1 | 4/2009 |

OTHER PUBLICATIONS

Official Letter dated Jan. 30, 2015, from the China Patent Office for corresponding China Patent Application No. 20131005-1892.9.

* cited by examiner

*Primary Examiner* — Allen Parker
(74) *Attorney, Agent, or Firm* — Patterson & Sheridan, LLP

(57) ABSTRACT

A method of forming a light-emitting diode includes: providing a substrate having one or more first openings passing through the substrate; forming a sacrificial layer on the substrate; forming an epitaxial layer on the sacrificial layer; connecting a supporting substrate with the epitaxial layer; and separating the substrate from the epitaxial layer by selectively etching the sacrificial layer.

19 Claims, 25 Drawing Sheets

METHOD OF FORMING LIGHT-EMITTING DIODE

REFERENCE TO RELATED APPLICATION

This application is a division of U.S. patent application Ser. No. 12/981,776, entitled "METHOD OF FORMING LIGHT-EMITTING DIODE", filed on Dec. 30, 2010, now pending, which claims the right of priority based on Taiwan Patent Application Ser. No. 098146467, filed Dec. 31, 2009, the content of which is hereby incorporated by reference.

TECHNICAL FIELD

The application relates to a method of making a light-emitting diode, and more particularly to a method of replacing a substrate of the light-emitting diode with the help of a sacrificial layer.

DESCRIPTION OF BACKGROUND ART

A Light-emitting diode epitaxial thin film is usually grown on a GaAs substrate which absorbs light. To improve the light-emitting efficiency, the GaAs substrate is etched away after the grown epitaxial layer is bonded to another suitable substrate. However, it is not cost effective to dissolve the recyclable GaAs substrate. Moreover, the As residue can easily cause the environmental pollution.

SUMMARY OF THE DISCLOSURE

The present application provides a method of recycling a growth substrate of a light-emitting diode. The method includes: providing a substrate having one or more first openings passing through the substrate; forming a sacrificial layer on the substrate; forming an epitaxial layer on the sacrificial layer; connecting a supporting substrate with the epitaxial layer; and separating the substrate from the epitaxial layer by selectively etching the sacrificial layer.

DETAILED DESCRIPTION OF PREFERRED EMBODIMENTS

Figure 1A:
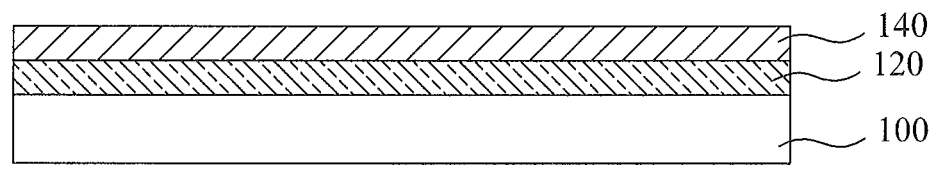
FIGS. 1A~1E and FIGS. 1A'~1E' illustrate cross sectional views and top views of steps of forming a light-emitting diode 190 in accordance with an embodiment of the present application.
Figure 1A:
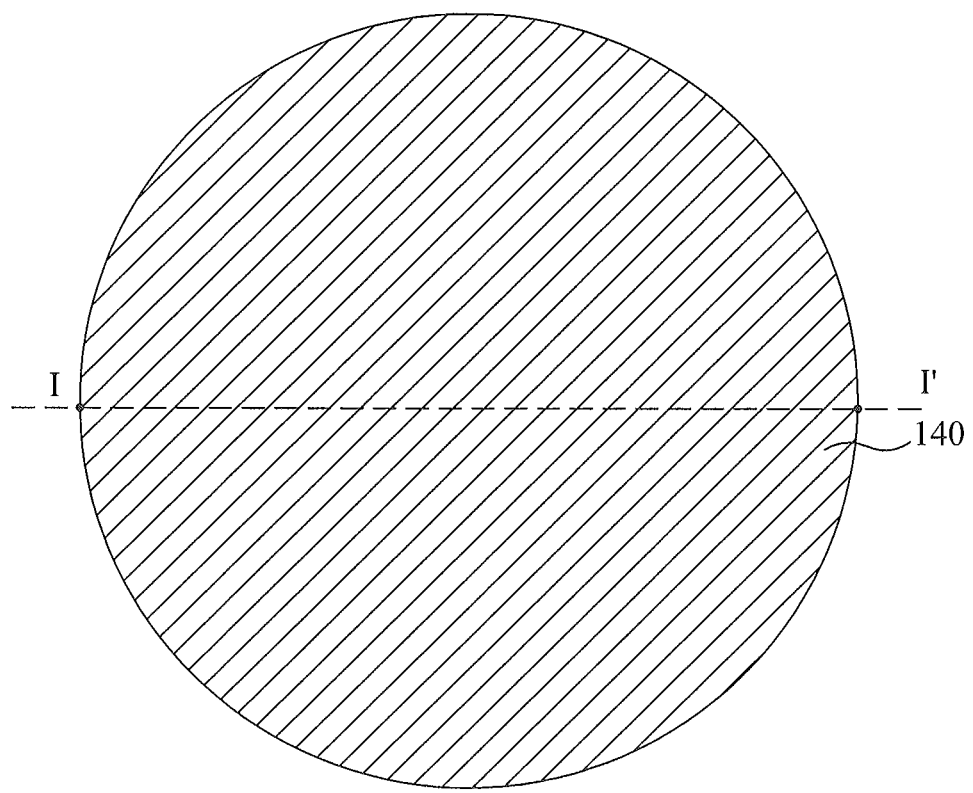

The embodiments are described hereinafter in accompany with drawings. The similar part is designated by the same reference numeral. It is noted that the dimensions of the various elements illustrated in the various figures are not to scale. Moreover, some conventional parts, materials, and processing techniques are omitted in the description for simplification.

Referring to FIGS. 1A and 1A', a sacrificial layer 120 and an epitaxial layer 140 are sequentially formed on a growth substrate 100. The growth substrate 100 is composed of at least one element of nitrogen, aluminum, gallium, arsenic, zinc, silicon, and oxygen, for example, the growth substrate 100 is an n-type GaAs. The epitaxial layer 140 is a multi-layer structure and can be composed of at least one element of nitrogen, aluminum, gallium, indium, arsenic, phosphorus, silicon, and oxygen. However, each layer of the multi-layer structure can have different composition element, for example, the multi-layer structure includes an n-type GaAs lower contact layer, an n-type $Al_xGa_{1-x}As$ lower cladding layer, a $Al_yGa_{1-y}As$ active layer, a p-type $Al_zGa_{1-z}As$ upper cladding layer, and a p-type GaAs upper contact layer, herein x, y, and z are between 0 and 1. The epitaxial layer 140 has a thickness of between 1 μm and 100 μm. In the present embodiment, the sacrificial layer 120 and the epitaxial layer 140 are formed by epitaxial growth. The sacrificial layer 120 can be composed of at least one element of aluminum and arsenic. For example, an AlAs sacrificial layer can be selectively-etched away by an etchant having a lower etching rate to the growth substrate 100, the epitaxial layer 140, and the following supporting layer. The sacrificial layer 120 preferably has a thickness of between 3000 Å and 5000 Å. In addition, the growth substrate 100 can have p-type conductivity.

Figure 1B:
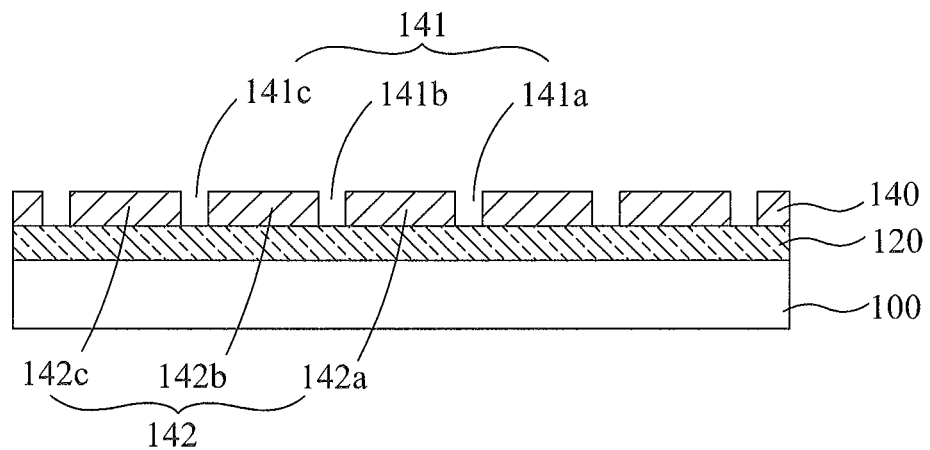
Figure 1B:
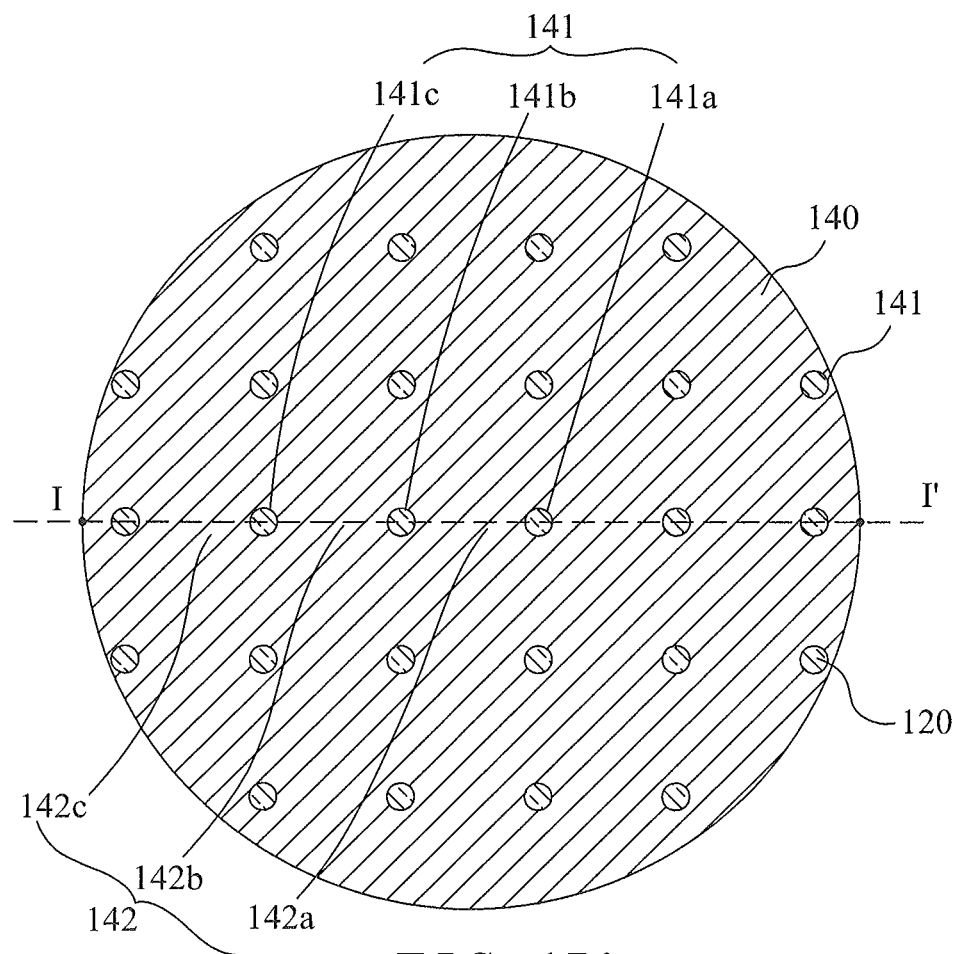

Referring to FIGS. 1B and 1B', the epitaxial layer 140 is patterned to form one or more epitaxial layer openings 141 which pass through the epitaxial layer 140 in order to expose the sacrificial layer 120 under thereof. The objectives of forming the several epitaxial layer openings are, for example, for positioning the light-emitting diode chips, or making an etchant flow to the sacrificial layer 120. As the objective described above, the opening or recess in other embodiment is not limited to forming on the epitaxial layer. The opening can be formed by photolithography and etching process. As shown in FIG. 1B, the several epitaxial layer openings 141 are formed on the surface of the epitaxial layer 140 in a matrix or random configuration. The epitaxial layer opening 141 can have a shape of circle, rectangle, polygon, or other suitable geometry. The size of the epitaxial l layer opening 141 can be adjusted according to the requirement. In one embodiment, after being patterned, the epitaxial layer region 142 (i.e. the patterned epitaxial layer 140) still surrounds the epitaxial layer openings 141. For example, FIG. 1B' illustrates the epitaxial layer region 142a surrounding the openings 141a, the epitaxial layer region 142b surrounding the opening 141b, and the epitaxial layer region 142c surrounding the opening 141c. As shown in the drawing, the epitaxial layer regions 142a, 142b, and 142c are integrated with each other. In other words, the patterned epitaxial layer 142 is a continuous structure. No isolated island appears in the patterned epitaxial layer 142 after forming the epitaxial layer opening 141. In the present embodiment, the epitaxial layer opening 141 is illustrated to penetrate the epitaxial layer 140. However, the epitaxial layer opening 141 can also penetrate the sacrificial layer 120 partially or thoroughly. In another embodiment, besides the epitaxial layer opening 141, a sacrificial recess (not shown) corresponding to at least one epitaxial layer opening 141 is formed on the sacrificial layer 120. In a further embodiment, besides the epitaxial layer opening 141, a sacrificial opening (not shown) penetrating the sacrificial layer 120 and corresponding to at least one epitaxial layer opening 141 is formed on the sacrificial layer 120.

Figure 1C:
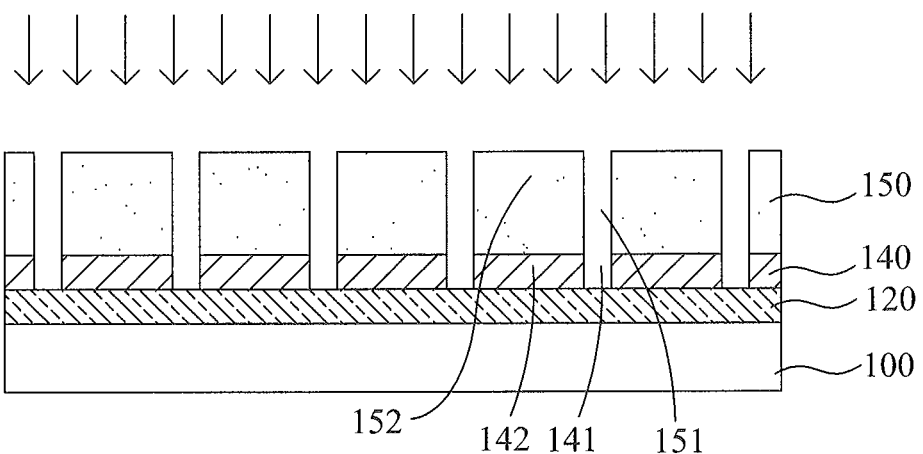
Figure 1C:
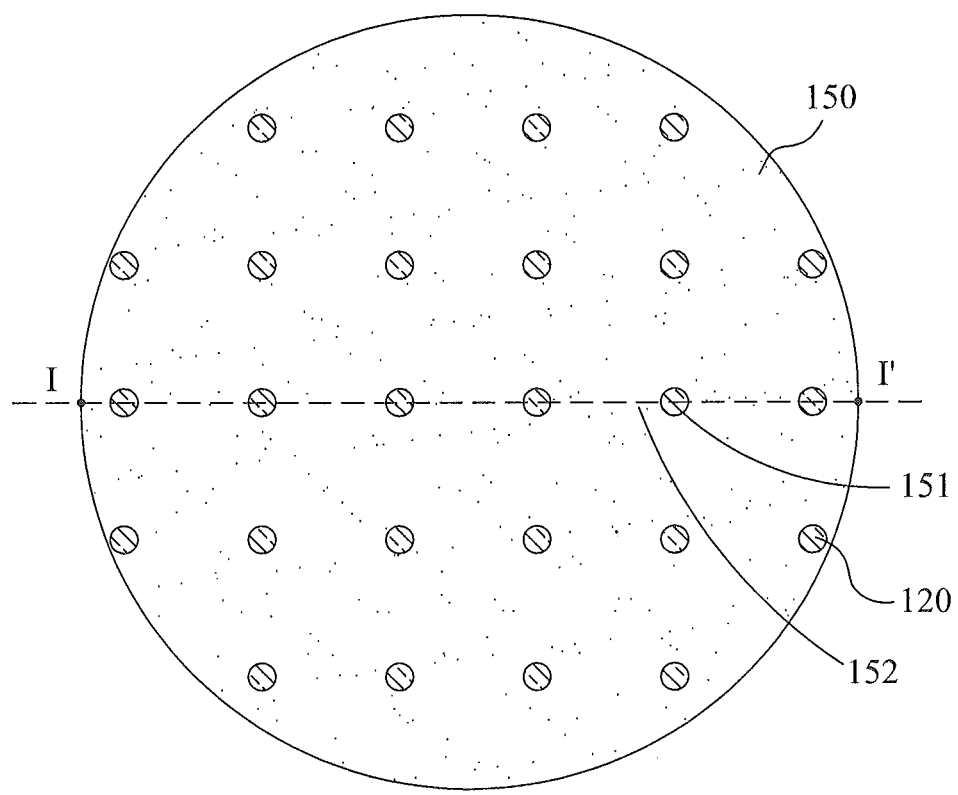

Referring to FIGS. 1C and 1C', a supporting layer 150 is formed on the epitaxial layer 140 which has epitaxial layer openings 141. The supporting layer 150 has supporting layer openings 151 penetrating the supporting layer 150 and connecting to the corresponding epitaxial layer openings 141. In other words, the supporting layer 150 is formed on the upper surface of the epitaxial layer 140 exclusive of the epitaxial layer openings 141. In one embodiment, the supporting layer 150 has a pattern similar to the patterned epitaxial layer 140, and therefore continuously surrounds the supporting layer openings. However, in another embodiment, the supporting layer 150 has a pattern different to the patterned epitaxial layer 140. In other words, the epitaxial layer openings 141 are different to the supporting layer openings 151 in at least one of the layout, opening geometry, and quantity. The supporting layer 150 can be used to replace the growth substrate 100 so as to support the epitaxial layer 140; the growth substrate therefore can be removed in following steps. If there is no supporting layer 150, the epitaxial layer 140 is too thin to carry out. In the present embodiment, the supporting layer 150 can be selected from but not limited to a photo resistor, metal, or electroplating metal, which has a thickness of between 50 μm and 300 μm.

Referring to FIGS. 1C and 1C', after forming the supporting layer 150, the sacrificial layer 120 is selectively etched away such that the growth substrate 100 can be separated from the epitaxial layer 140. In detail, the sacrificial layer 120 can be selectively etched away using an etchant having a lower etching rate to the growth substrate 100, the epitaxial layer 140, and the supporting layer 150. The etchant can remove the sacrificial layer 120 via the epitaxial layer openings 140 and the supporting layer openings 150 such that the growth substrate 100 is separated from the epitaxial layer 140. However, the sacrificial layer 120 is not necessary to be completely removed; the volume or the area contacting its upper and lower layers can be shrunk such that the growth substrate 100 can be separated from the epitaxial layer 140. In the present embodiment, citric acid as the etchant is applied. However, other suitable wet etching or dry etching method can be also introduced into the present invention.

Figure 1D:
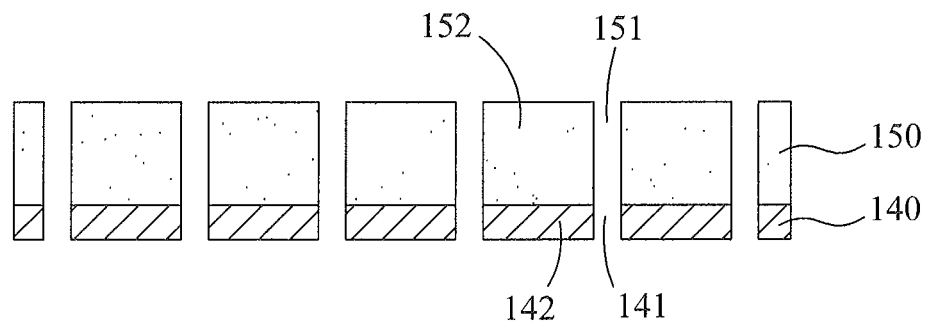
Figure 1D:
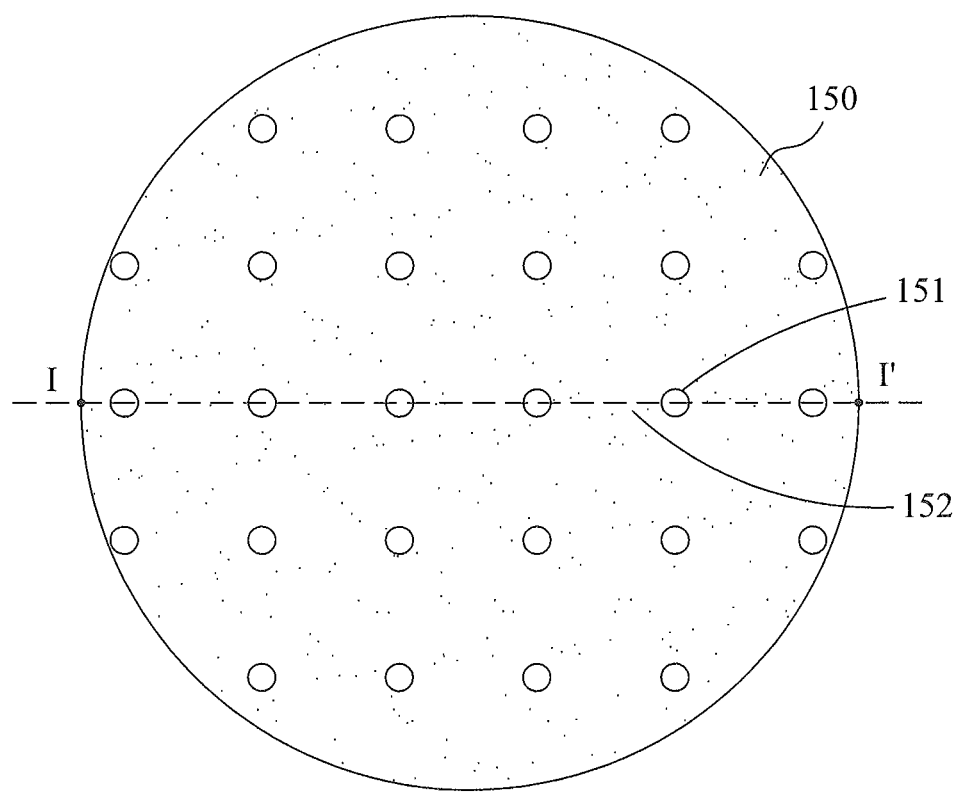

FIGS. 1D and 1D' illustrate the structures after removing the sacrificial layer 120 and separating the growth substrate 100. It is also noted that the epitaxial layer 140 and the supporting layer 150 are connected with each other; the epitaxial layer 142 is formed to continuously surround the epitaxial layer openings; and the supporting layer 152 is formed to continuously surround the supporting layer openings 151. Because no or few discrete islands exist within the structure, as long as the supporting layer 150 has a sufficient thickness, the following process can further carry on.

Figure 1E:
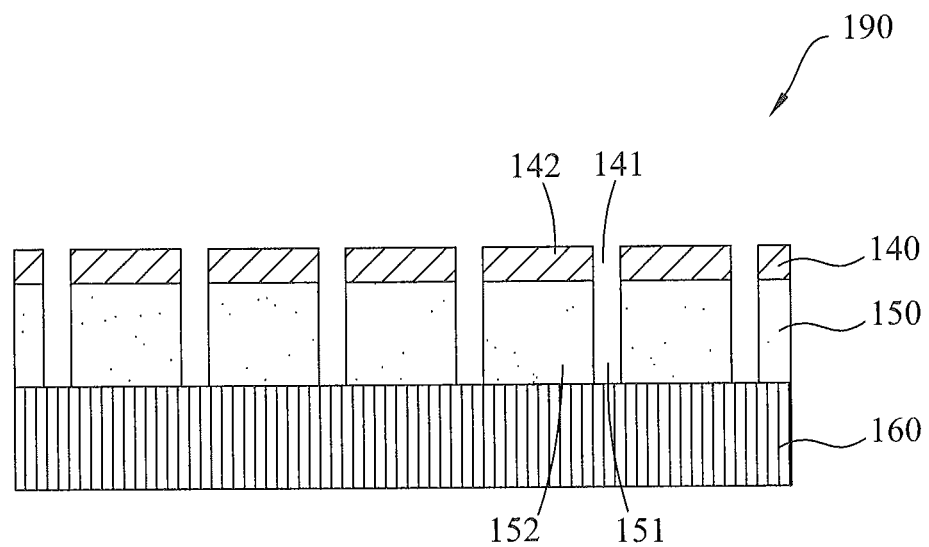
Figure 1E:
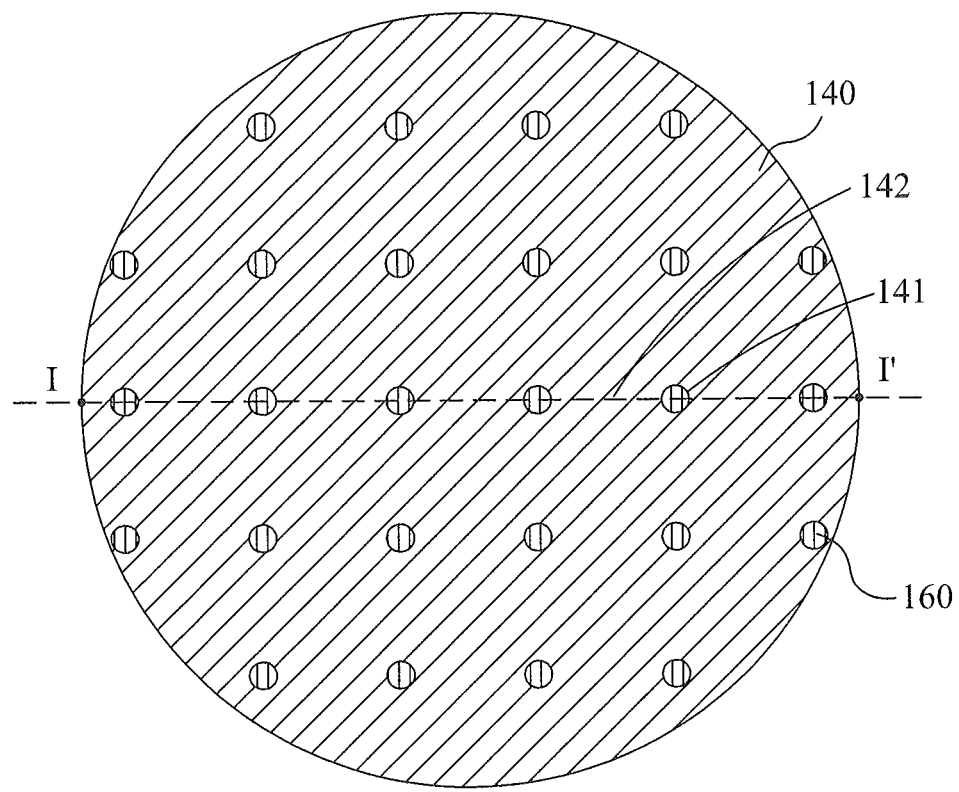

FIGS. 1E and 1E' illustrate an optional step in accordance with an embodiment of the present application. The step includes providing a supporting substrate 160 to join to the supporting layer 150 of FIGS. 1D and 1D'. The object of the present step is, such as, to reinforce the supporting layer 150. The material of the supporting substrate 160 is glass, metal, semiconductor, plastic, ceramic, or other suitable material.

Figure 2A:
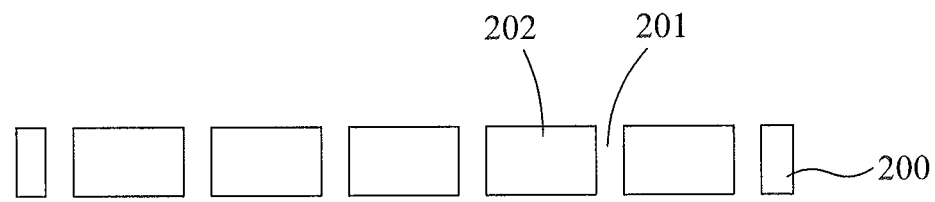
FIGS. 2A~2D and FIGS. 2A'~2D' illustrate cross sectional views and top views of steps of forming a light-emitting diode 290 in accordance with an embodiment of the present application.
Figure 2A:
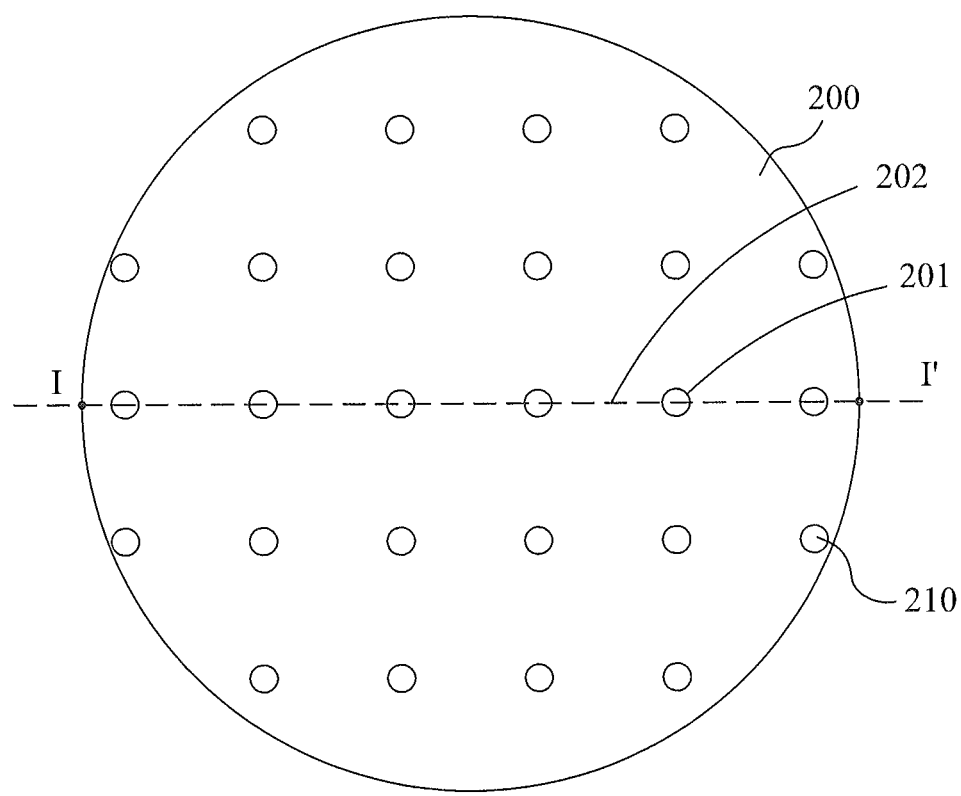

FIGS. 2A and 2A'~2D and 2D' illustrate processes of making a light-emitting diode 290 in accordance with an embodiment of the present invention FIGS. 2A'~2D' are top views, and FIGS. 2A~2D are cross-sectional views along lines in FIGS. 2A'~2D'. Comparing with the above embodiments, the present embodiment is characterized by the openings of the growth substrate and the replacement of the supporting layer by the supporting substrate. The similar part is designated by the same reference numeral, uses similar material, and has similar thickness without additional explanation.

As shown in FIGS. 2A and 2A', a growth substrate 200 is provided to have one or more substrate openings 201 penetrating the growth substrate 200. The growth substrate 202 is formed to continuously surround the substrate openings 201. In other words, the remaining part of the growth substrate 202, after forming the substrate openings 201, is an integral structure and does not include a discrete island. The substrate openings 201 can be formed by mechanical machining, laser, dry etching, or wet etching.

Figure 2B:
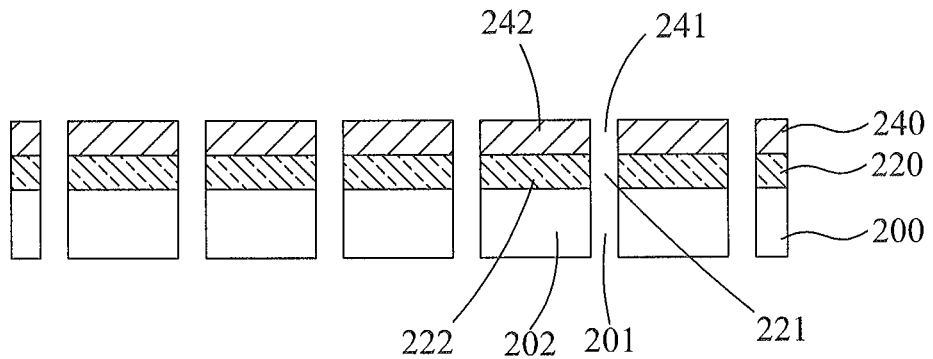
Figure 2B:
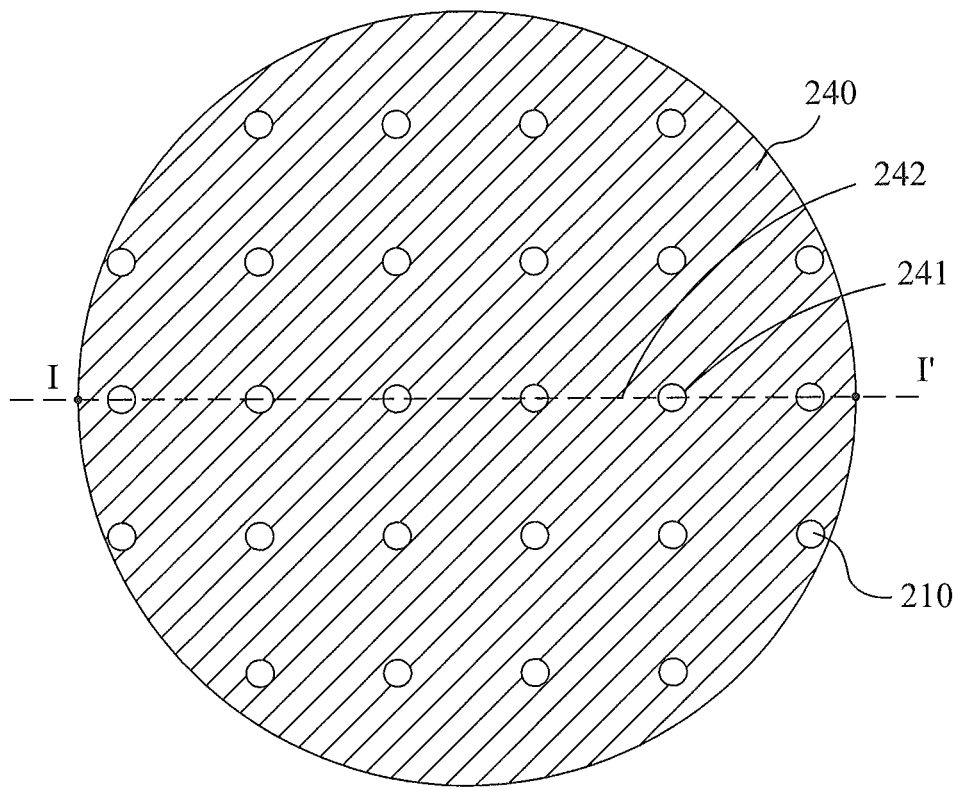
Figure 2C:
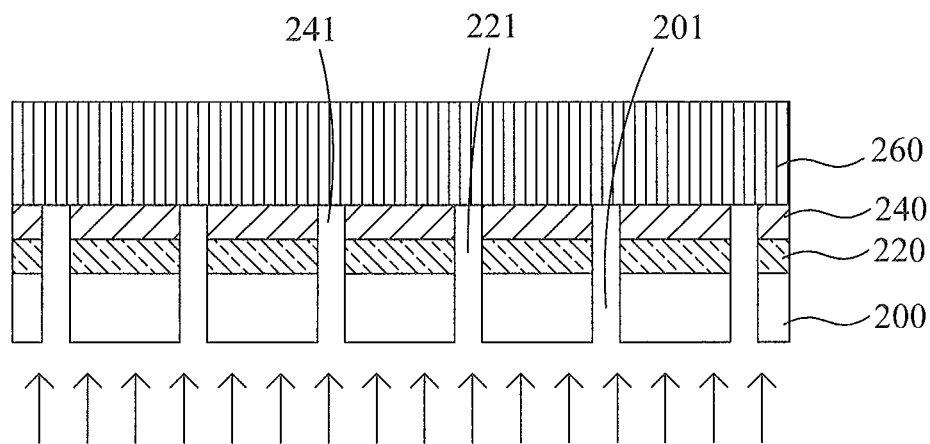
Figure 2C:
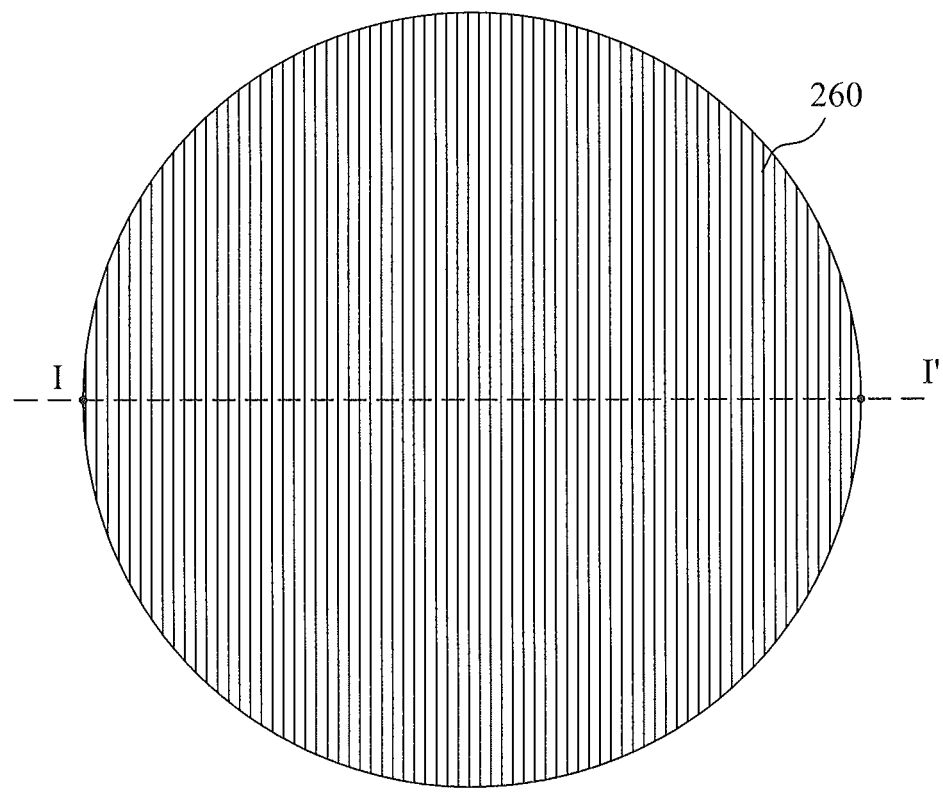

As shown in FIGS. 2B and 2B', a sacrificial layer 220 is formed on the growth substrate 200. The sacrificial layer 220 has sacrificial layer openings 221 penetrating the sacrificial layer 220 so as to reach the substrate openings 201. The sacrificial layer region 222 is formed to continuously surround the sacrificial layer openings 221. The sacrificial layer 220 can be epitaxially formed.

Referring to FIGS. 2B and 2B', a supporting substrate 260 is provided to connect to the epitaxial layer 240 formed in FIGS. 2B and 2B'. The material of the supporting substrate 260 is such as glass, metal, semiconductor, plastic, ceramic, or other suitable material. In the present embodiment, the growth substrate 200 is replaced by the supporting substrate 260. Also referring to FIGS. 2C and 2C', after connecting the supporting substrate 260 and the epitaxial layer 240, the sacrificial layer 220 is selectively etched away so as to separate the growth substrate 200 from the epitaxial layer 240. In detail, the sacrificial layer 220 can be selectively etched away using an etchant having a lower etching rate to the growth substrate 200, the epitaxial layer 240, and the supporting substrate 260. The etchant can remove the sacrificial layer 220 via the substrate openings 201 and the sacrificial layer openings 221 such that the growth substrate 200 is separated from the epitaxial layer 240. However, the sacrificial layer 220 is not necessary to be completely removed; the volume or the area contacting its upper and lower layers can be shrunk such that the growth substrate 200 can be separated from the epitaxial layer 240. In the present embodiment, citric acid as the etchant is applied. However, other suitable wet etching or dry etching method can be also introduced into the present invention.

Figure 2D:
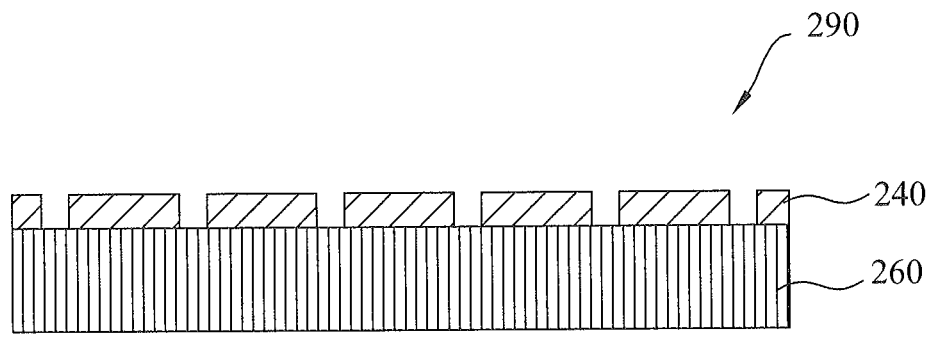
Figure 2D:
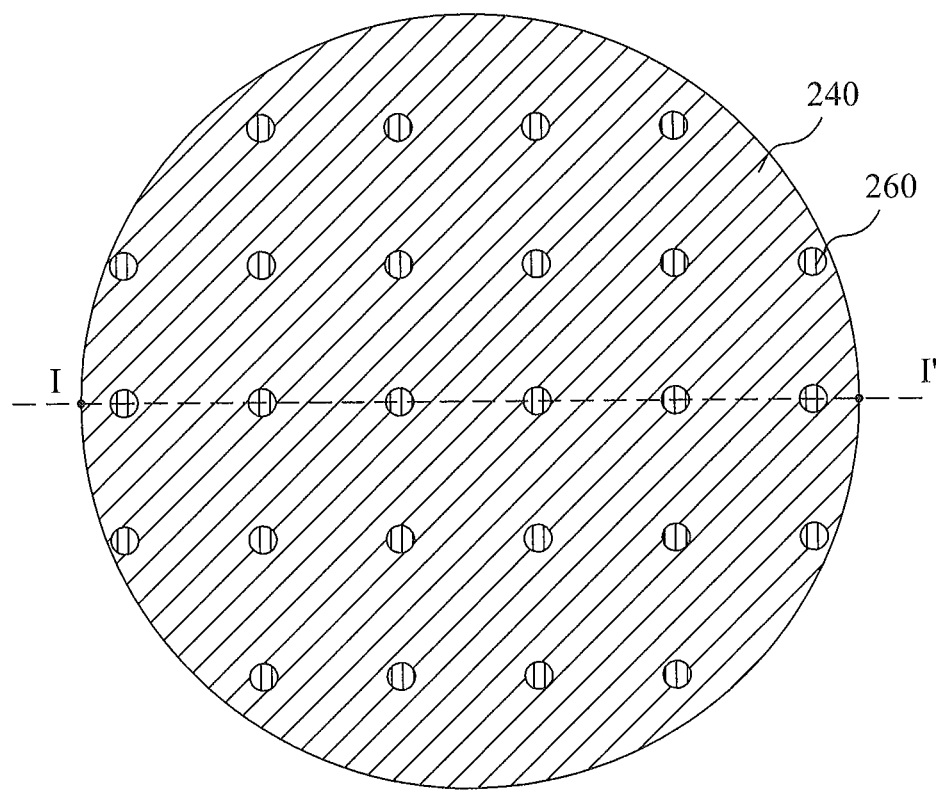

FIGS. 2D and 2D' illustrate the structures after removing the sacrificial layer 220 and separating the growth substrate 200. It is noted that only the epitaxial layer 240 and the supporting substrate 260 are connected with each other. Therefore, as long as the supporting substrate 260 has a sufficient thickness, the following process can carry on.

Figure 3A:
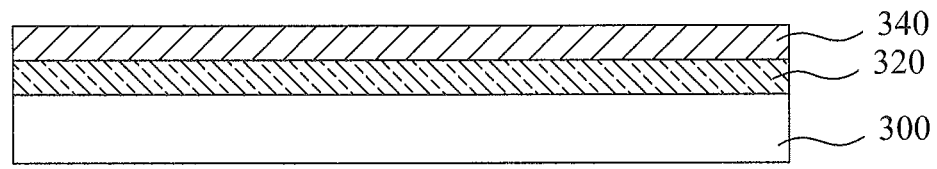
FIGS. 3A~3F and FIGS. 3A'~3F' illustrate cross sectional views and top views of steps of forming a light-emitting diode 290 in accordance with an embodiment of the present application.
Figure 3A:
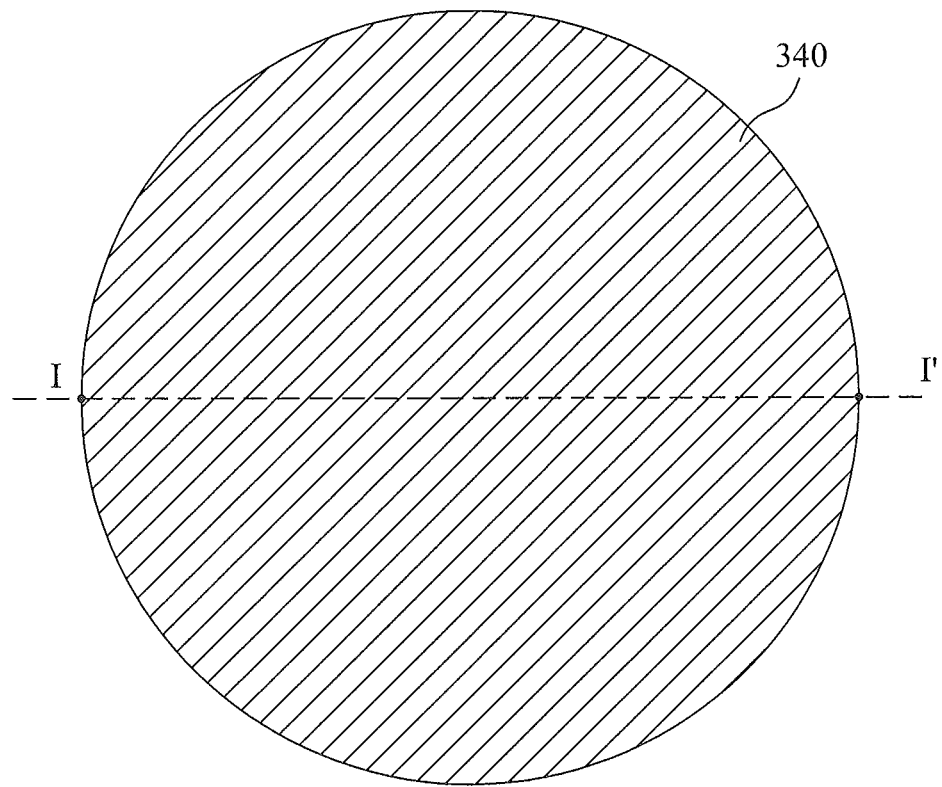

FIGS. 3A and 3A'~3D and 3D' illustrate processes of making a light-emitting diode 390 in accordance with an embodiment of the present invention. FIGS. 3A'~3F' are top views, and FIGS. 3A~3F are cross-sectional views along I-I' lines in FIGS. 3A'~3F'. Comparing with the description of FIG. 1, the present embodiment is characterized by providing a patterned supporting substrate as a mask to form a pattern on the epitaxial layer such that the sacrificial layer is exposed for further etching process. The similar part is designated by the same reference numeral, uses similar material, and has similar thickness without additional explanation.

Figure 3B:
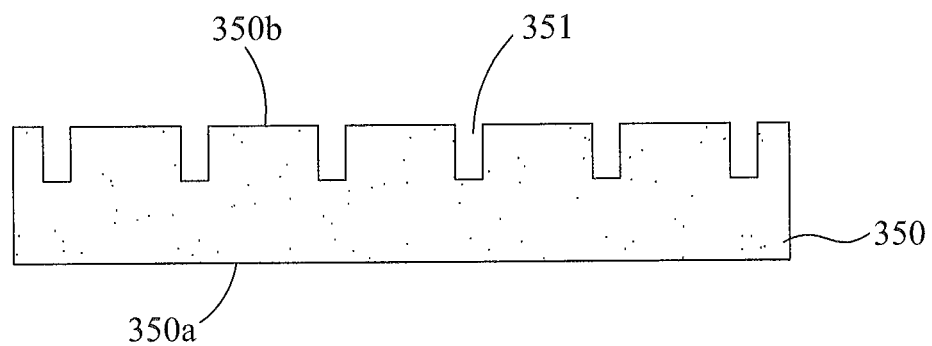
Figure 3B:
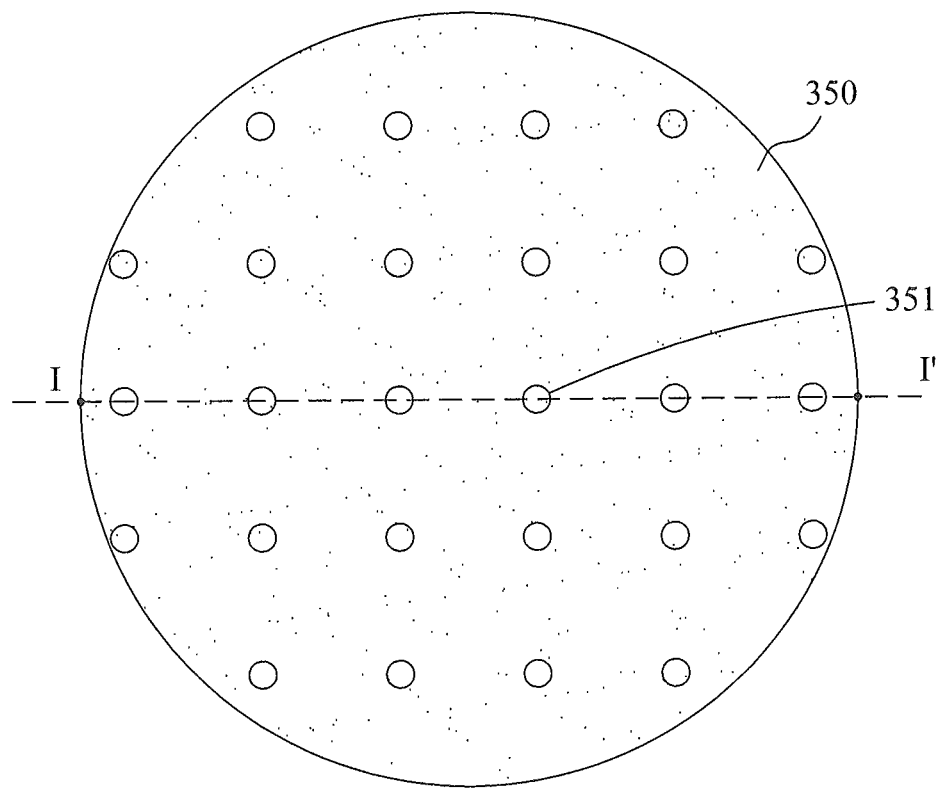
Figure 3C:
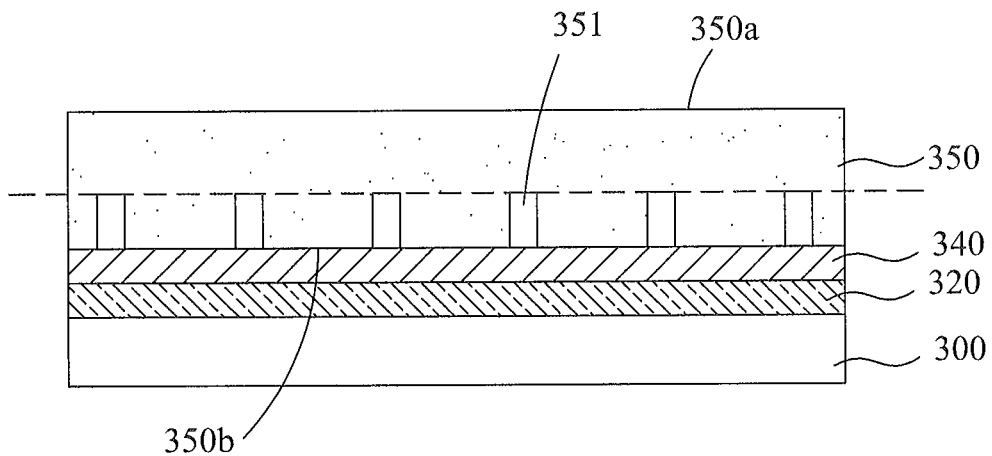
Figure 3C:
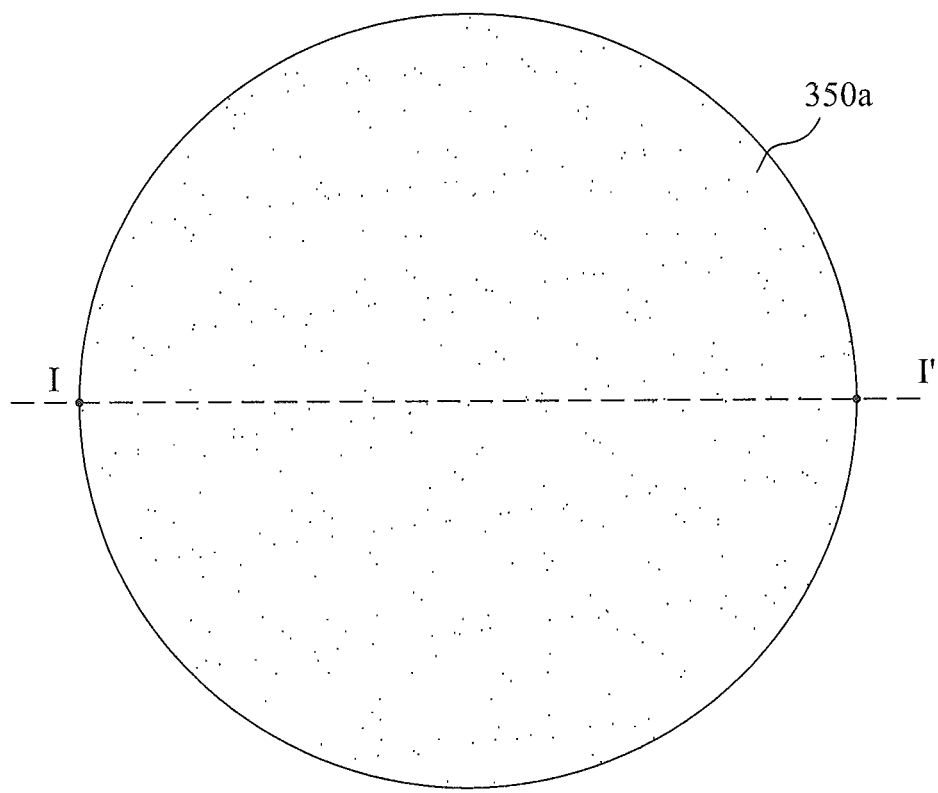

As shown in FIGS. 3A and 3A', a growth substrate 300 is provided, and a sacrificial layer 320 and an epitaxial layer 340 are sequentially formed on the growth substrate 300. Referring to FIGS. 3B and 3B', a supporting substrate 350, having an upper surface 350a and a lower surface 350b, is provided. The supporting substrate 350 has a sufficient thickness for handling. The material of the supporting substrate 350 can include at least one of Si, $Al_2O_3$, metal, semiconductor, plastic, and ceramic. One or more recesses are formed on the lower surface 350b by laser, dry etching, or wet etching, for example. In the present status, the recess is not formed to penetrate the supporting substrate 350.

Figure 3D:
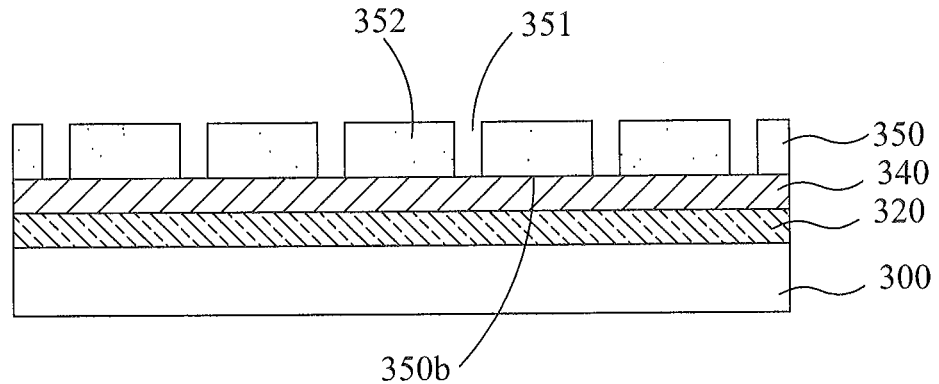
Figure 3D:
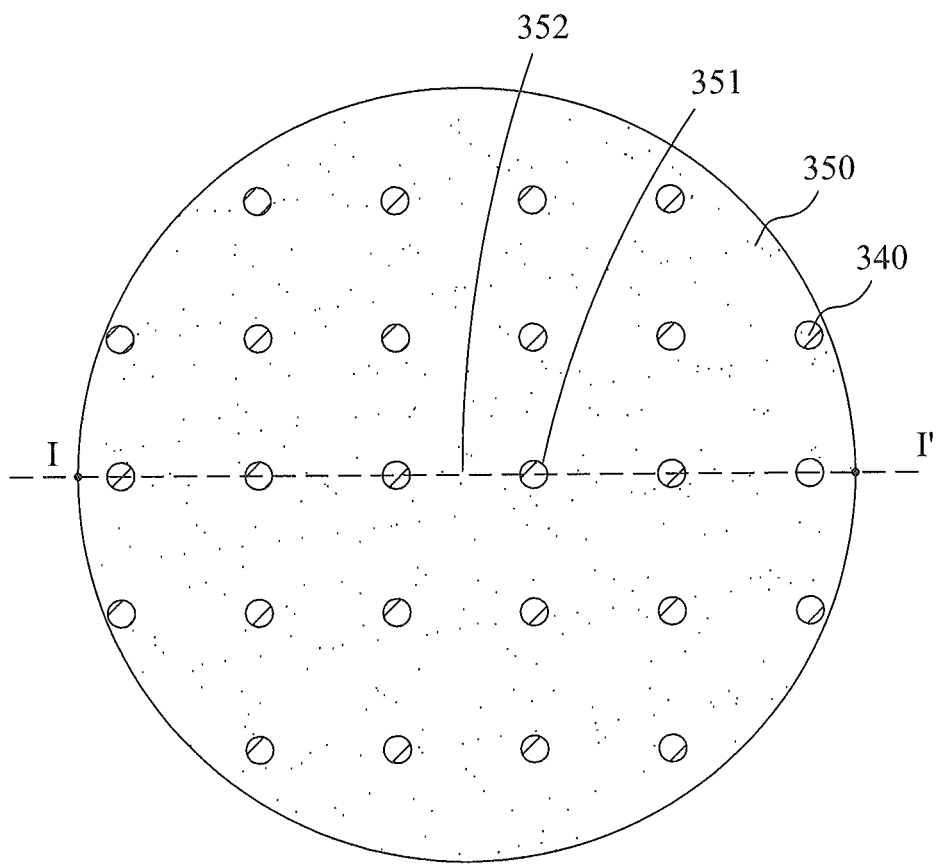
Figure 3E:
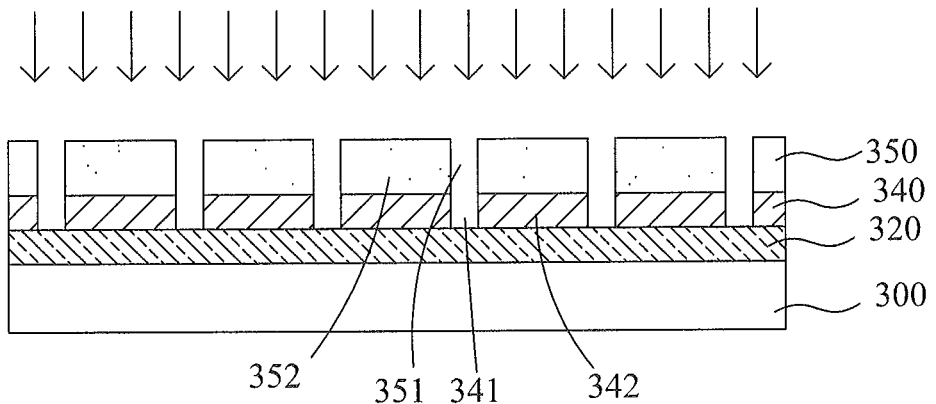
Figure 3E:
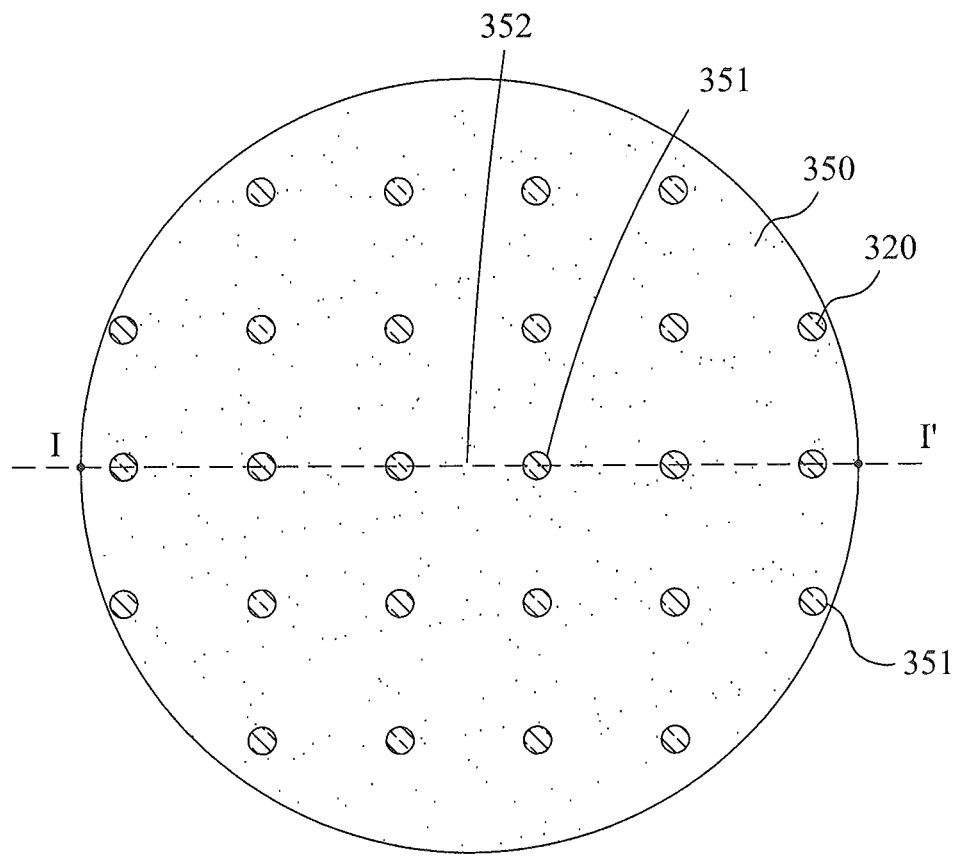

FIGS. 3D and 3D' illustrate structures exposing the recesses (openings) 351 by removing part of the supporting substrate 350. In the structures, the supporting substrate region 352 is formed to continuously surround the recesses 351. The supporting substrate 350 is then used as a mask such that the epitaxial layer 340 is etched away to form the epitaxial layer openings 341 penetrating the epitaxial layer 340 and exposing the sacrificial layer 320. FIGS. 3E and 3E' illustrate the structures after etching the epitaxial layer 340. The epitaxial layer region 342 is formed to continuously surround the epitaxial layer openings 341.

Referring to FIGS. 3E and 3E', the sacrificial layer 320 is selectively etched away so as to separate the growth substrate 300 from the epitaxial layer 340. In detail, the sacrificial layer 320 can be selectively etched away using an etchant having a lower etching rate to the growth substrate 300, the epitaxial layer 340, and the supporting substrate 350. The etchant can remove the sacrificial layer 320 via the supporting substrate recesses (openings) 351 and the epitaxial layer openings 341 such that the growth substrate 300 is separated from the epitaxial layer 340. However, the sacrificial layer 320 is not necessary to be completely removed; the volume or the area contacting its upper and lower layers can be shrunk such that the growth substrate 300 can be separated from the epitaxial layer 340. In the present embodiment, citric acid as the etchant is applied. However, other suitable wet etching or dry etching method can be also introduced into the present invention.

Figure 3F:
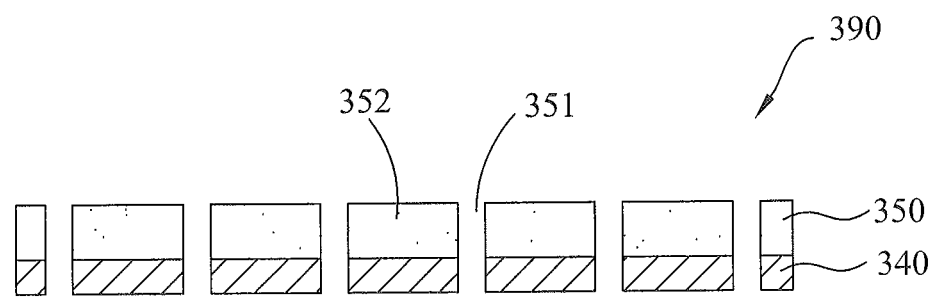
Figure 3F:
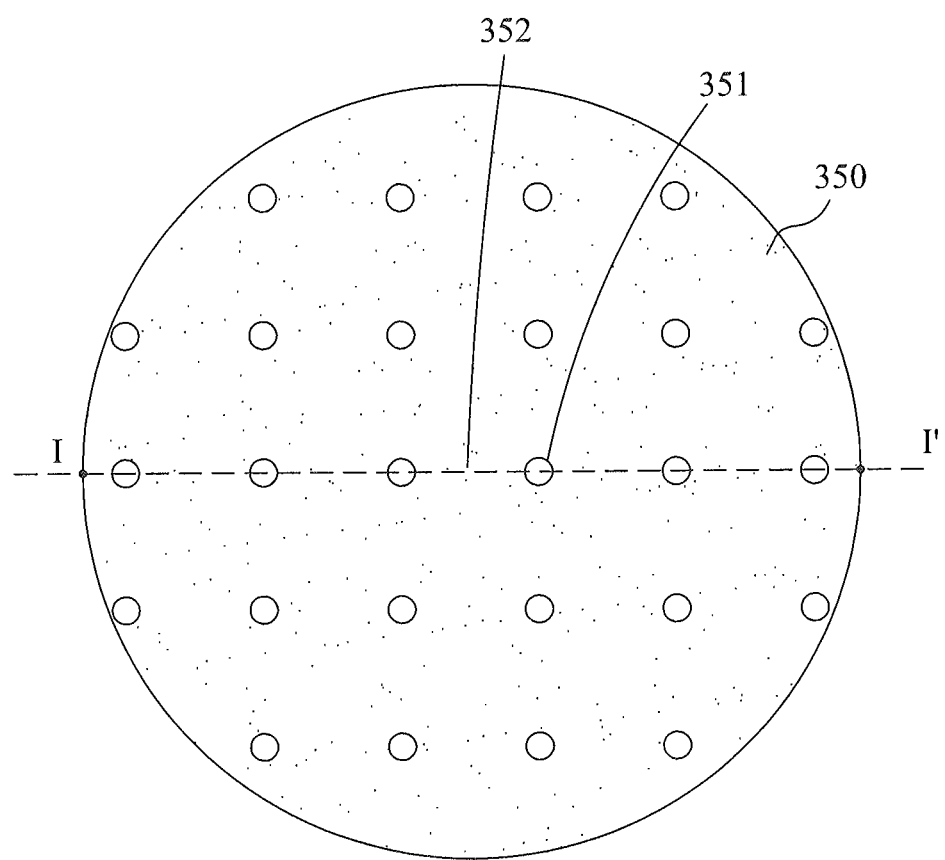
Figure 4A:
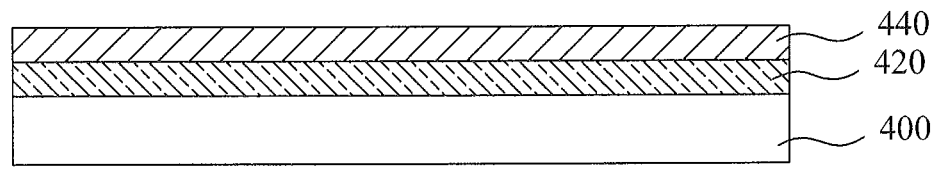
FIGS. 4A~4E and FIGS. 4A'~4E' illustrate cross sectional views and top views of steps of forming a light-emitting diode 290 in accordance with an embodiment of the present application.
Figure 4A:
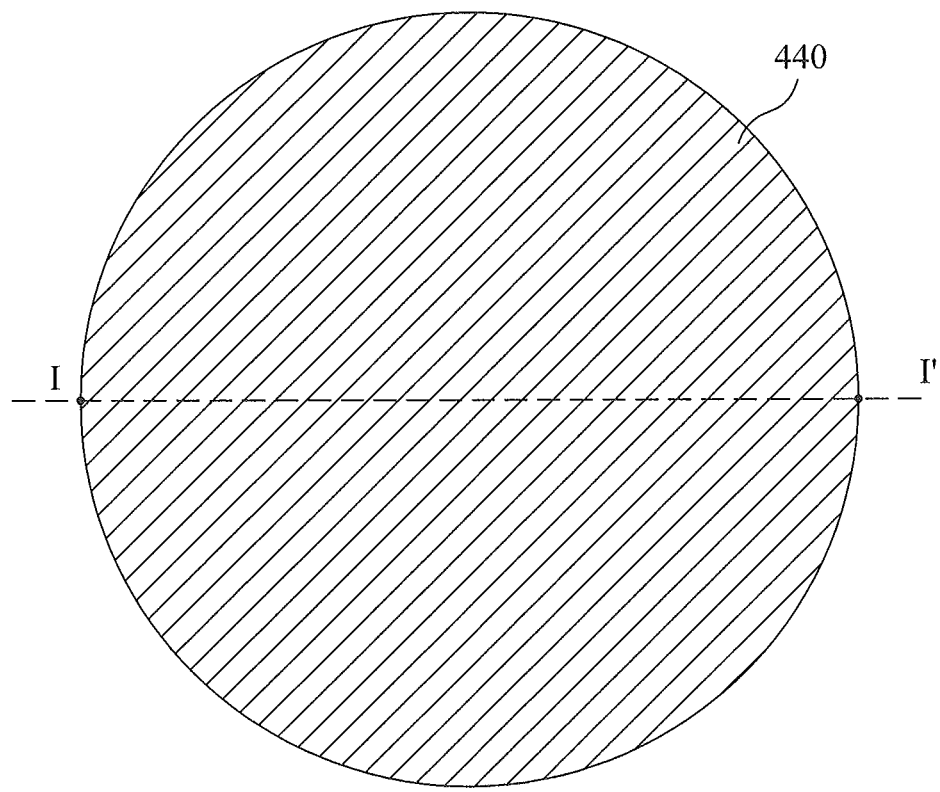

FIGS. 3F and 3F' illustrate the structures after removing the sacrificial layer 320 and separating the growth substrate 300. It is noted that only the epitaxial layer 340 and the supporting substrate 350 are connected with each other. No or few discrete island regions exist in this structure. Therefore, as long as the supporting substrate 350 has a sufficient thickness, the following process can carry on FIGS. 4A and 4A'~4E and 4E' illustrate processes of making a light-emitting diode 490 in accordance with an embodiment of the present invention. FIGS. 4A'~4E' are top views, and FIGS. 4A~4E are cross-sectional views along I-I' lines in FIGS. 4A'~4E'. Comparing with the description of FIG. 3, the present embodiment is characterized by patterning a supporting substrate formed on a temporary substrate; and the patterned supporting substrate has openings penetrating the supporting substrate. The similar part is designated by the same reference numeral, uses similar material, and has similar thickness without additional explanation.

Figure 4B:
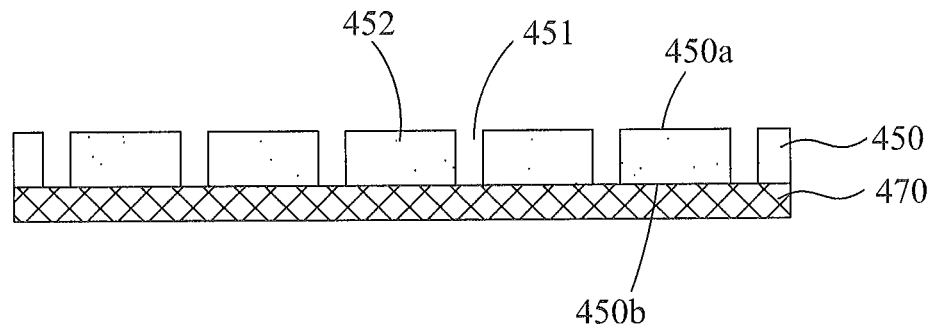
Figure 4B:
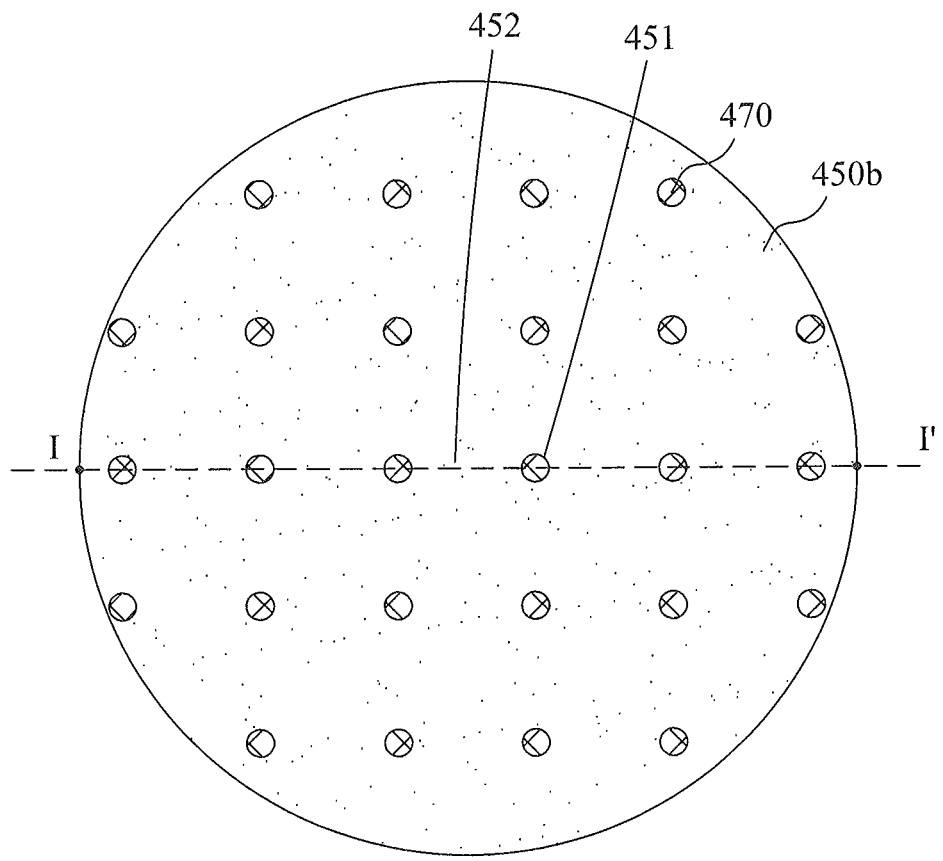

As shown in FIGS. 4A and 4A', a growth substrate 400 is provided, and a sacrificial layer 420 and an epitaxial layer 440 are sequentially formed on the growth substrate 400. Referring to FIGS. 4B and 4B', a temporary substrate 470 is provided to connect to a supporting substrate 450. The material of the temporary substrate 470 can include at least one of glass, metal, semiconductor, plastic, ceramic, and other suitable material. The supporting substrate 450 is patterned to form one or more supporting substrate openings 451 penetrating the supporting substrate 450. The supporting substrate region 452 is formed to continuously surround the supporting substrate openings 451. The supporting substrate 450 can be patterned by laser, dry etching, wet etching, or cutting. The supporting substrate 450 has an upper surface 450a connecting to the temporary substrate 470, and a lower surface 450b opposite to the upper surface 450a.

Figure 4C:
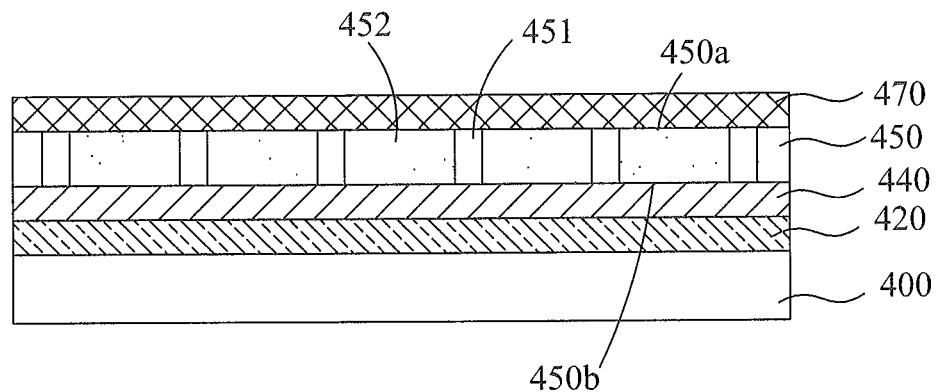
Figure 4C:
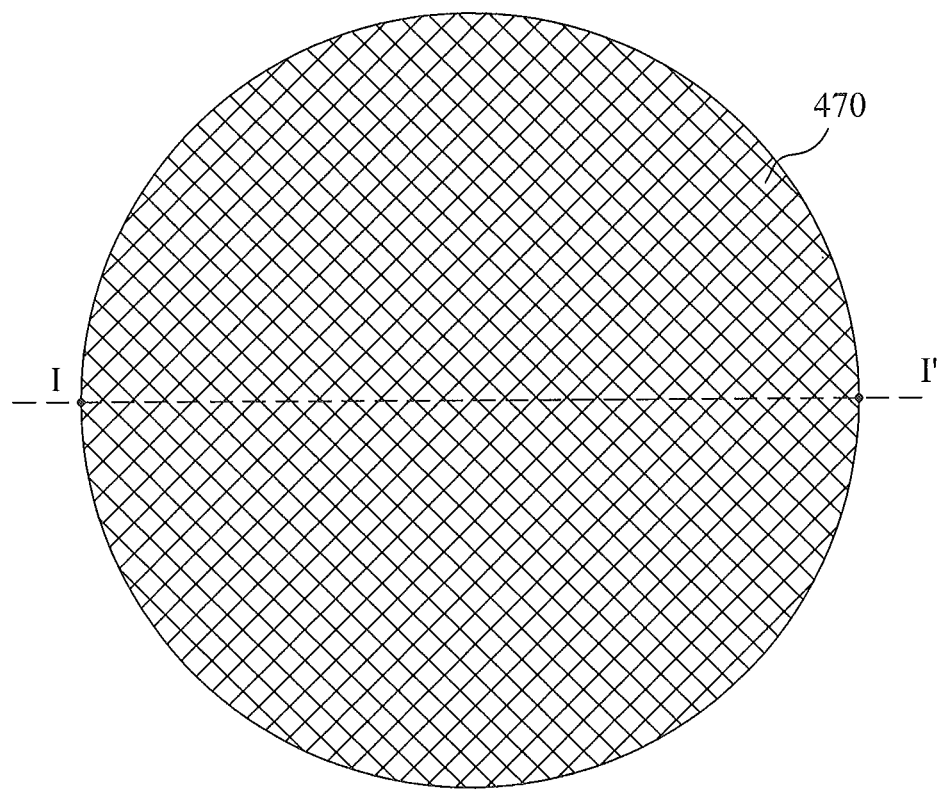

As shown in FIGS. 4C and 4C', the supporting substrate 450 is connected to the epitaxial layer 440 by lower surface 450b. The temporary substrate 470 is then removed to expose the upper surface 450a inside the supporting substrate openings 451. The supporting substrate 450 is used as a mask such that the epitaxial layer 440 is etched away to form one or more epitaxial layer openings 441 penetrating the epitaxial layer 440 and exposing the sacrificial layer 420. The etched epitaxial layer 440 has a pattern similar to or different from the patterned supporting substrate 450. The epitaxial layer 440 can be also patterned by defining the masked area. The etched epitaxial layer 440 has a structure as shown in FIGS. 4D and 4D'.

Figure 4D:
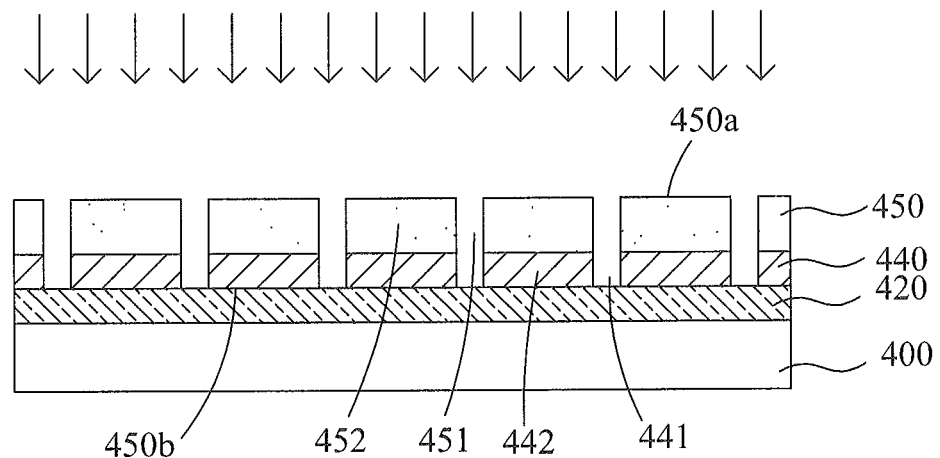
Figure 4D:
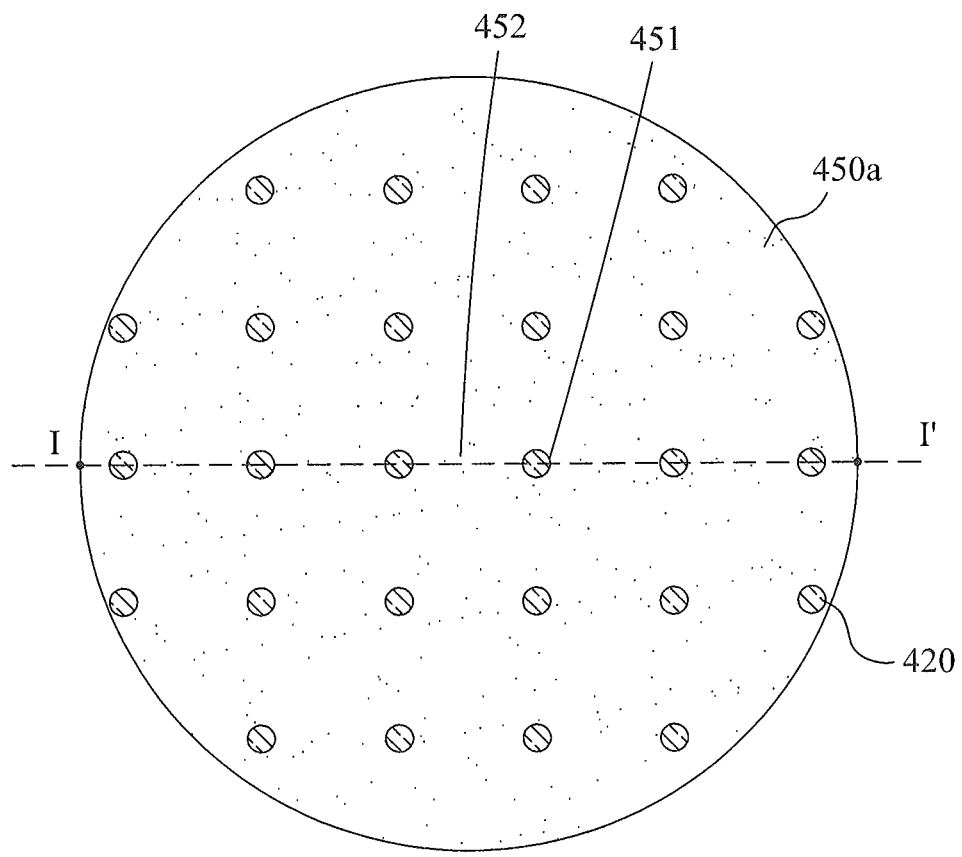

Referring to FIGS. 4D and 4D', the sacrificial layer 320 is selectively etched away so as to separate the growth substrate 400 from the epitaxial layer 440. In detail, the sacrificial layer 420 can be selectively etched away using an etchant having a lower etching rate to the growth substrate 400, the epitaxial layer 440, and the supporting substrate 450. The etchant can remove the sacrificial layer 420 via the supporting substrate openings 451 and the epitaxial layer openings 441 such that the growth substrate 400 is separated from the epitaxial layer 440. However, the sacrificial layer 420 is not necessary to be completely removed; the volume or the area contacting its upper and lower layers can be shrunk such that the growth substrate 400 can be separated from the epitaxial layer 440. In the present embodiment, citric acid as the etchant is applied. However, other suitable wet etching or dry etching method can be also introduced into the present application.

Figure 4E:
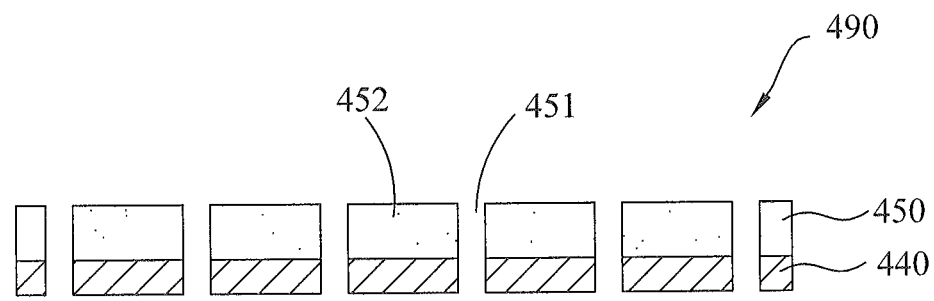
Figure 4E:
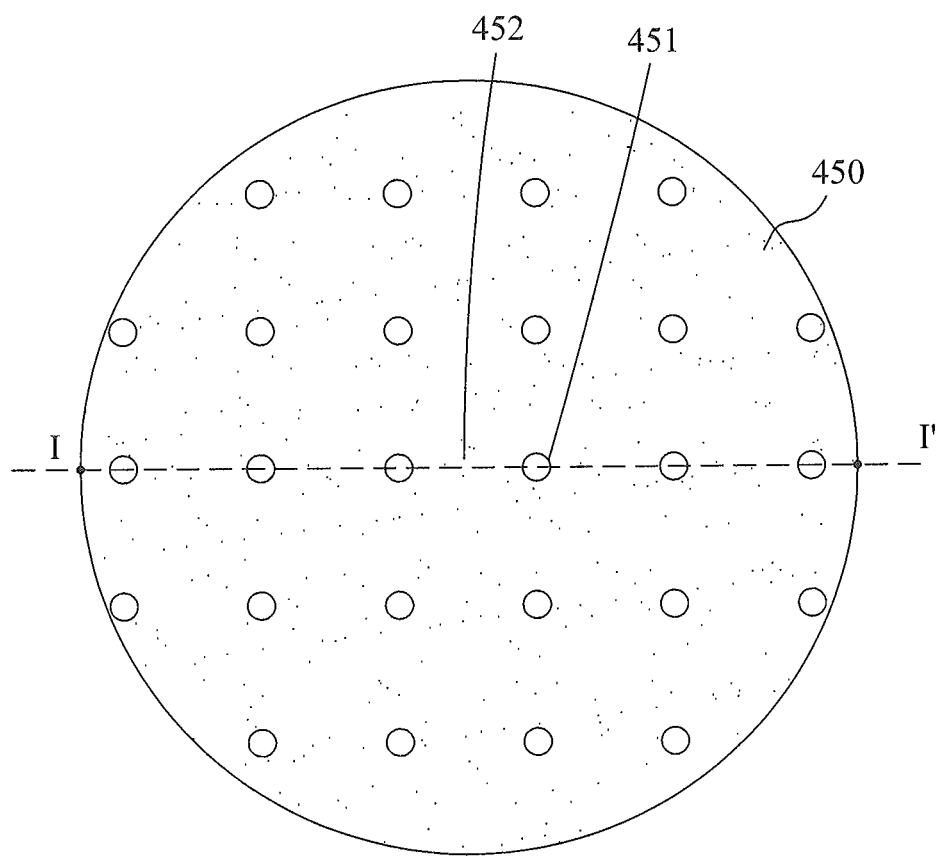

FIGS. 4E and 4E' illustrate the structures after removing the sacrificial layer 420 and separating the growth substrate 400. It is noted that only the epitaxial layer 440 and the supporting substrate 450 are connected with each other. No or few discrete island regions exist in this structure. Therefore, as long as the supporting substrate 450 has a sufficient thickness, the following process can carry on.

Figure 5A:
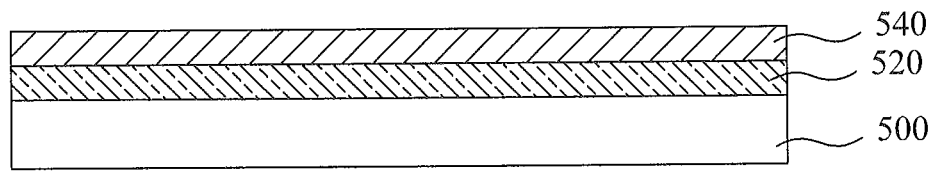
FIGS. 5A~5E and FIGS. 5A'~5E' illustrate cross sectional views and top views of steps of forming a light-emitting diode 290 in accordance with an embodiment of the present application.
Figure 5A:
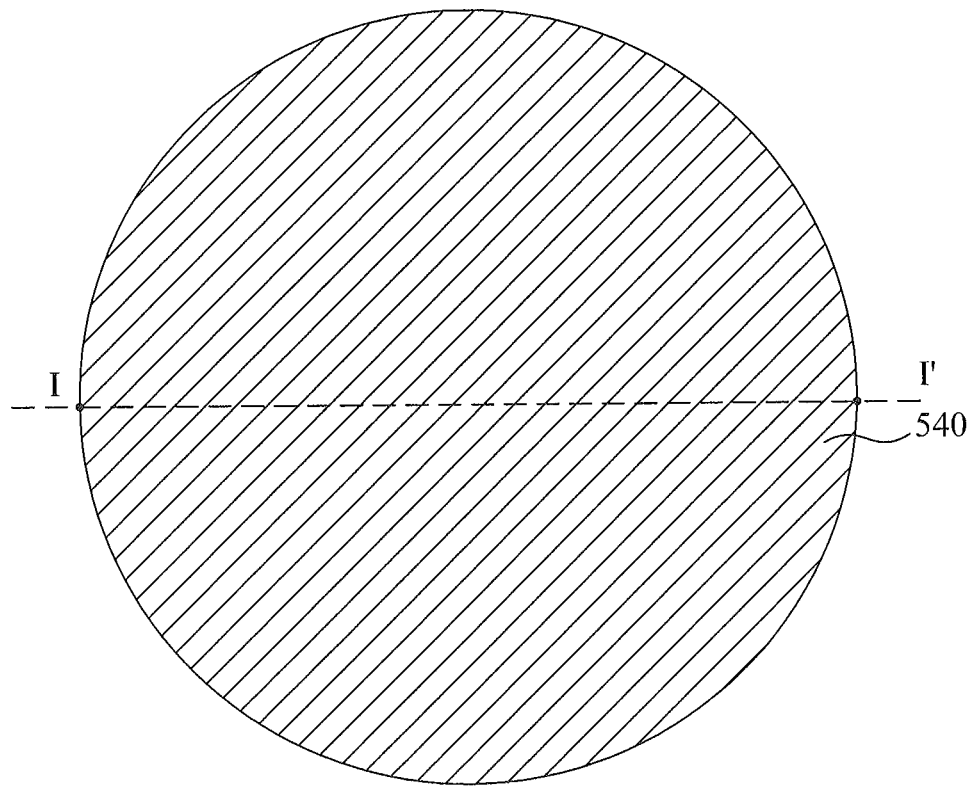

FIGS. 5A and 5A'~5E and 5E' illustrate processes of making a light-emitting diode 590 in accordance with an embodiment of the present invention. FIGS. 5A'~5E' are top views, and FIGS. 5A~5E are cross-sectional views along I-I' lines in FIGS. 5A'~5E'. Comparing with above embodiments, the present embodiment is characterized by not introducing a temporary substrate. The similar part is designated by the same reference numeral, uses similar material, and has similar thickness without additional explanation.

Figure 5B:
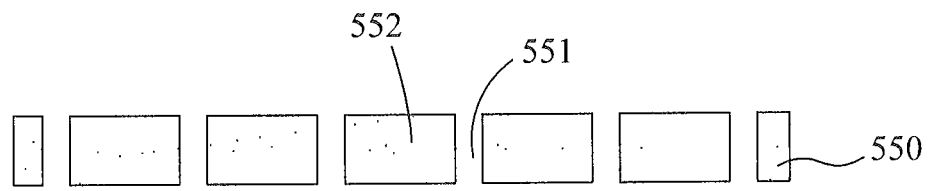
Figure 5B:
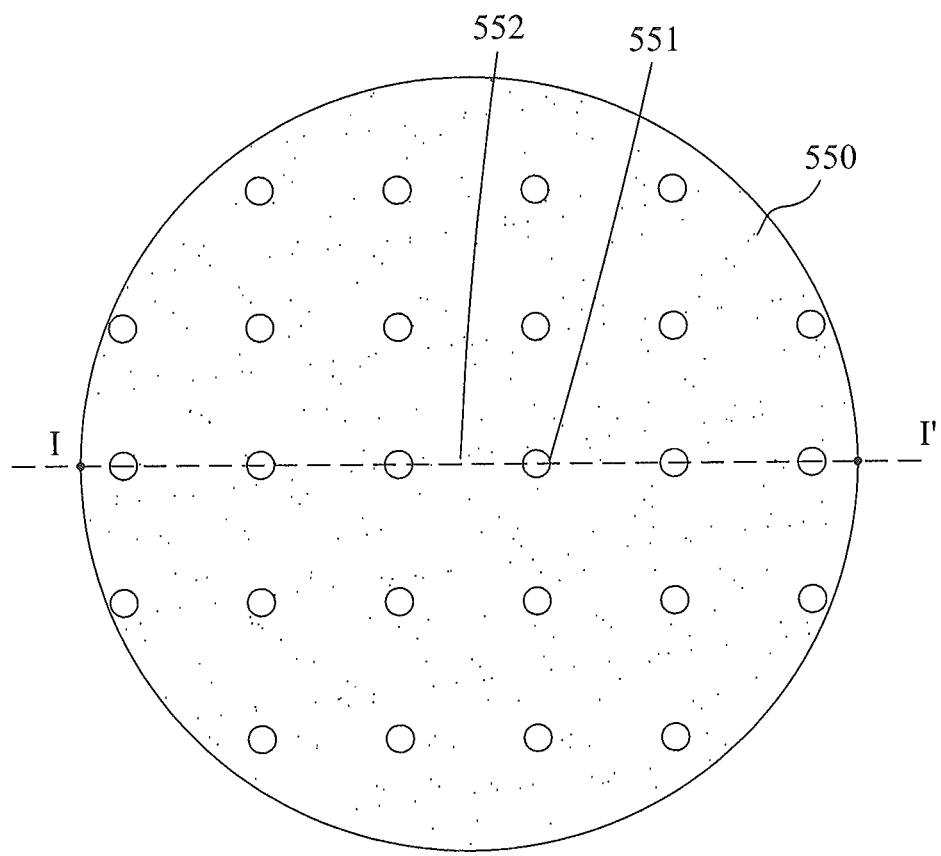

As shown in FIGS. 5A and 5A', a growth substrate 500 is provided, and a sacrificial layer 520 and an epitaxial layer 540 are sequentially formed on the growth substrate 500. Referring to FIGS. 5B and 5B', a supporting substrate 550 is provided. The supporting substrate 550 needs a sufficient thickness for following process. The supporting substrate 550 is patterned to form one or more supporting substrate openings 551 penetrating the supporting substrate 550. The supporting substrate region 552 is formed to continuously surround the supporting substrate openings 551. The supporting substrate 550 can be patterned by laser, dry etching, or wet etching.

Figure 5C:
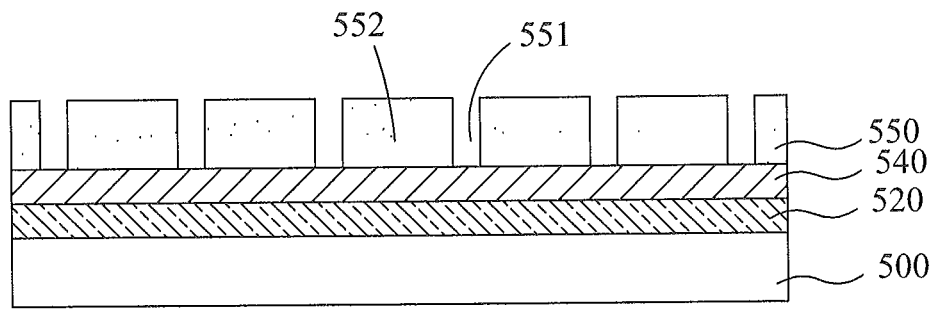
Figure 5C:
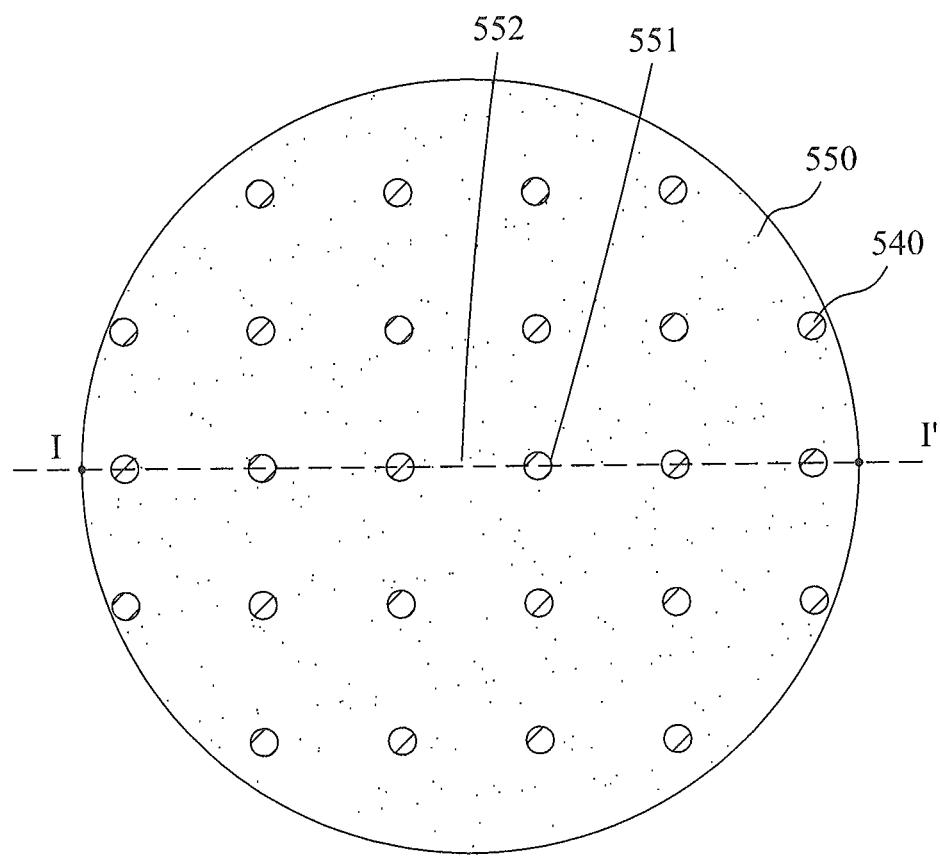

As shown in FIGS. 5C and 5C', the supporting substrate 550 is connected to the epitaxial layer 540. The supporting substrate 550 is used as a mask such that the epitaxial layer 540 is etched away to from one or more epitaxial layer openings 541 penetrating the epitaxial layer 540 and exposing the sacrificial layer 520. The etched epitaxial layer 540 has a pattern similar to or different from the patterned supporting substrate 550. The epitaxial layer 540 can be also patterned by defining the masked area. The etched epitaxial layer 540 has a structure as shown in FIGS. 5D and 5D'.

Figure 5D:
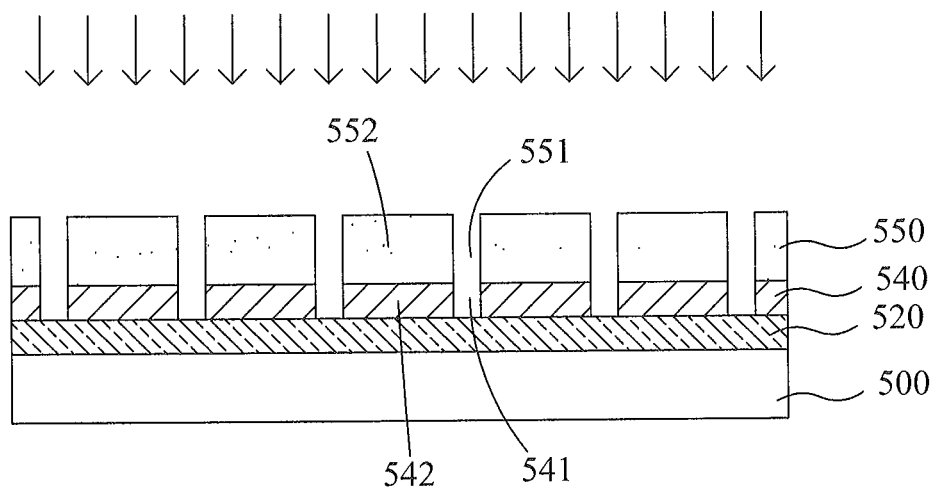
Figure 5D:
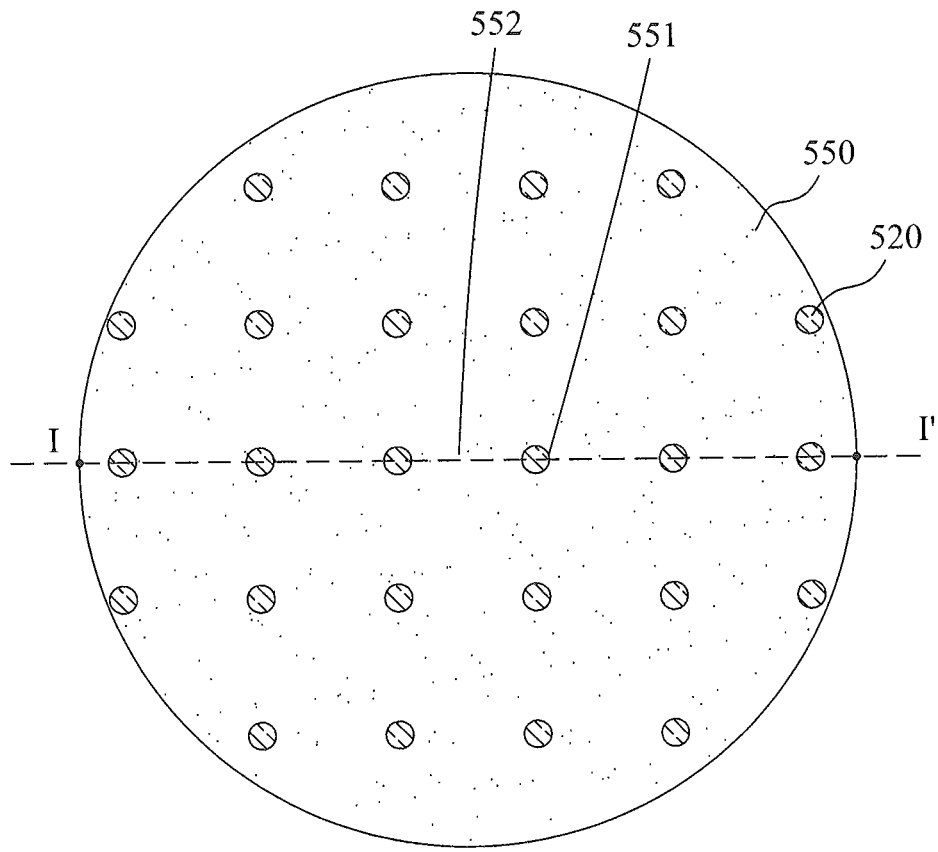

Referring to FIGS. 5D and 5D', the sacrificial layer 520 is selectively etched away so as to separate the growth substrate 500 from the epitaxial layer 540. In detail, the sacrificial layer 520 can be selectively etched away using an etchant having a lower etching rate to the growth substrate 500, the epitaxial layer 540, and the supporting substrate 550. The etchant can remove the sacrificial layer 520 via the supporting substrate openings 551 and the epitaxial layer openings 541 such that the growth substrate 500 is separated from the epitaxial layer 540. However, the sacrificial layer 520 is not necessary to be completely removed; the volume or the area contacting its upper and lower layers can be shrunk such that the growth substrate 500 can be separated from the epitaxial layer 540. In the present embodiment, citric acid as the etchant is applied. However, other suitable wet etching or dry etching method can be also introduced into the present invention.

Figure 5E:
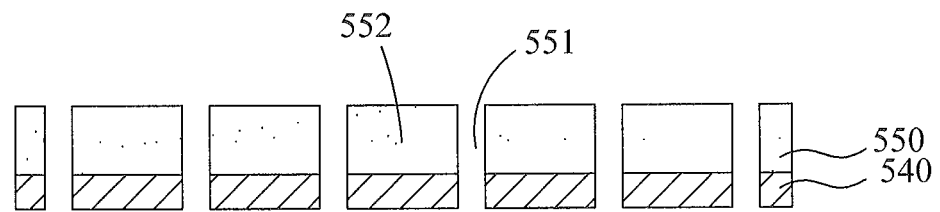
Figure 5E:
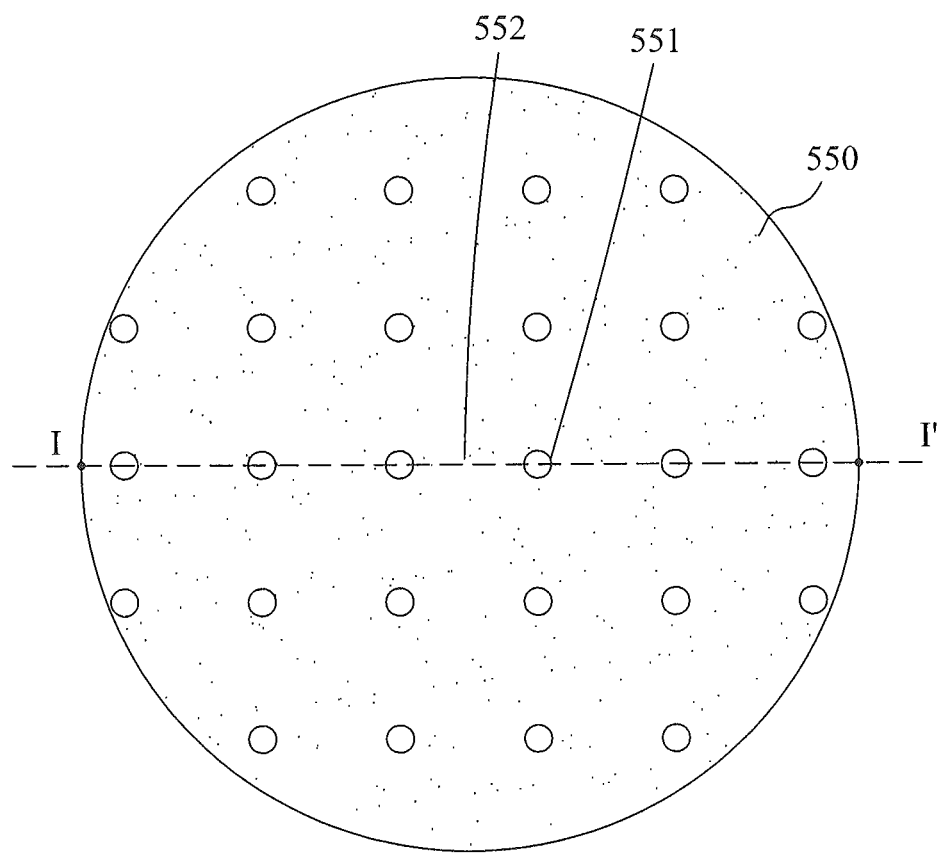

FIGS. 5E and 5E' illustrate the structures after removing the sacrificial layer 520 and separating the growth substrate 500. It is noted that only the epitaxial layer 540 and the supporting substrate 550 are connected with each other. No or few discrete island regions exist in this structure. Therefore, as long as the supporting substrate 550 has a sufficient thickness, the following process can carry on Although the invention is explained above, it is not limited the range, the sequence in practice, the material in practice, or the method in practice. Any modification or decoration for this invention is not away from the spirit and the range of this invention.

What is claimed is:

1. A method of forming light-emitting diode comprising steps of:
   providing a substrate having one or more first openings passing entirely through the substrate;
   forming a sacrificial layer on the substrate having the one or more first openings;
   forming an epitaxial layer on the sacrificial layer;
   connecting a supporting substrate with the epitaxial layer; and
   separating the substrate from the epitaxial layer by selectively etching the sacrificial layer.

2. The method of claim 1, wherein the step of forming the sacrificial layer comprises: forming one or more second openings that are passing through the sacrificial layer.

3. The method of claim 2,
   wherein one or more third openings pass through the epitaxial layer, and
   wherein at least one third opening is connected with at least one second opening.

4. The method of claim 3, wherein at least one third opening is connected with at least one first opening through at least one second opening.

5. The method of claim 2, wherein at least one second opening is connected with at least one first opening.

6. The method of claim 2, wherein the sacrificial layer surrounds the second opening.

7. The method of claim 2, wherein the one or more second openings are discretely distributed within the sacrificial layer.

8. The method of claim 1,
   wherein one or more third openings pass through the epitaxial layer.

9. The method of claim 8, wherein the one or more third openings are discretely distributed within the epitaxial layer.

10. The method of claim 8, wherein the third openings are formed in a matrix configuration.

11. The method of claim 8, wherein the third openings are formed in a random configuration.

12. The method of claim 1, wherein the step of selectively etching the sacrificial layer comprises: providing an etchant to etch the sacrificial layer through the one or more first openings and the one or more second openings.

13. The method of claim 12, wherein an etching rate of the etchant to the sacrificial layer is higher than that to the epitaxial layer.

14. The method of claim 1, wherein the growth substrate surrounds the one or more first openings.

15. The method of claim 1, wherein the one or more first openings are discretely distributed within the growth substrate.

16. The method of claim 1, wherein the growth substrate comprises a material selected from the group consisting of nitrogen, aluminum, gallium, arsenic, zinc, silicon, and oxygen.

17. The method of claim 1, wherein the sacrificial layer comprises a material selected from the group consisting of aluminum and arsenic.

18. The method of claim 1, wherein the supporting substrate comprises a material selected from the group consisting of glass, metal, semiconductor, plastics, and ceramics.

19. The method of claim 1, wherein the sacrificial layer has a thickness of between 3000 Å and 5000 Å.

* * * * *